(12) United States Patent
Becker et al.

(10) Patent No.: US 8,849,636 B2
(45) Date of Patent: Sep. 30, 2014

(54) ASSEMBLY AND METHOD FOR VERIFYING A REAL MODEL USING A VIRTUAL MODEL AND USE IN AIRCRAFT CONSTRUCTION

(75) Inventors: Benjamin Becker, Munich (DE); Holger Schmidt, Munich (DE); Ilke Oencue Calis, Hamburg (DE)

(73) Assignee: Airbus Operations GmbH, Hamburg (DE)

( * ) Notice: Subject to any disclaimer, the term of this patent is extended or adjusted under 35 U.S.C. 154(b) by 0 days.

(21) Appl. No.: 13/525,970

(22) Filed: Jun. 18, 2012

(65) Prior Publication Data
US 2012/0303336 A1 Nov. 29, 2012

Related U.S. Application Data

(63) Continuation of application No. PCT/EP2010/070155, filed on Dec. 17, 2010.

(30) Foreign Application Priority Data

Dec. 18, 2009 (DE) .......................... 10 2009 058 802

(51) Int. Cl.
| | | |
|---|---|---|
| *G06G 7/48* | (2006.01) | |
| *G06F 17/50* | (2006.01) | |
| *G06T 15/00* | (2011.01) | |
| *G06T 17/00* | (2006.01) | |
| *G01B 21/04* | (2006.01) | |
| *G01B 11/03* | (2006.01) | |
| *B64F 5/00* | (2006.01) | |

(52) U.S. Cl.
CPC ................ *G01B 11/03* (2013.01); *G01B 21/04* (2013.01); *B64F 5/00* (2013.01); *G06F 17/5095* (2013.01)
USPC ......... 703/8; 703/7; 703/1; 345/419; 345/420

(58) Field of Classification Search
CPC ... G06T 19/006; G06T 7/004; G06F 17/5095; G06F 3/04815
USPC .............................. 703/1, 7, 8; 345/419, 420
See application file for complete search history.

(56) References Cited

U.S. PATENT DOCUMENTS

| | | | | |
|---|---|---|---|---|
| 4,937,768 A | * | 6/1990 | Carver et al. ..................... | 703/1 |
| 4,945,488 A | * | 7/1990 | Carver et al. .................. | 700/182 |

(Continued)

OTHER PUBLICATIONS

German Patent Office, German Office Action dated Aug. 19, 2010 for German Patent Application No. 10 2009 058 802.7.

(Continued)

*Primary Examiner* — Akash Saxena
(74) *Attorney, Agent, or Firm* — Ingrassia Fisher & Lorenz, P.C.

(57) ABSTRACT

An arrangement for verifying a real model by using a virtual model is provided. The arrangement comprises a real model which has a real coordinate system, a virtual model which has a virtual coordinate system, a first position determination element, which is applied in/on the real model in a defined manner, and a real tool element, which is arranged in the real model. A position and/or orientation of the real tool element in the real model can be determined relative to the first position determination element. An operation of the real tool element can be triggered in the real model, and the operation of the real tool element can be imaged in the virtual model. The operation of the real tool element in the real model and the imaged operation in the virtual model can be logically or functionally assigned to one another.

16 Claims, 12 Drawing Sheets

(56) References Cited

U.S. PATENT DOCUMENTS

| | | | |
|---|---|---|---|
| 5,033,014 A * | 7/1991 | Carver et al. ................... 703/1 |
| 5,106,290 A * | 4/1992 | Carver et al. ................ 425/470 |
| 5,490,080 A * | 2/1996 | Jarrige et al. ................... 700/98 |
| 6,760,693 B1 * | 7/2004 | Singh et al. ..................... 703/8 |
| 7,054,793 B2 * | 5/2006 | Moritz et al. .................... 703/1 |
| 7,493,153 B2 | 2/2009 | Ahmed et al. |
| 7,676,079 B2 * | 3/2010 | Uchiyama et al. ............ 382/154 |
| 7,782,361 B2 * | 8/2010 | Kotake et al. ............ 348/207.99 |
| 7,966,159 B2 * | 6/2011 | Lambert ........................... 703/1 |
| 8,005,563 B2 * | 8/2011 | Cobb et al. .................... 700/114 |
| 8,022,955 B2 * | 9/2011 | Demizu et al. ................ 345/474 |
| 8,725,490 B2 * | 5/2014 | Athsani et al. .................... 704/2 |
| 2001/0016807 A1 * | 8/2001 | Hashima et al. ................ 703/22 |
| 2001/0025229 A1 * | 9/2001 | Moritz et al. ..................... 703/1 |
| 2002/0158873 A1 * | 10/2002 | Williamson ................... 345/427 |
| 2002/0171645 A1 * | 11/2002 | Weingarten .................... 345/423 |
| 2002/0196250 A1 * | 12/2002 | Anderson et al. ............. 345/420 |
| 2003/0227470 A1 | 12/2003 | Genc et al. |
| 2005/0008256 A1 * | 1/2005 | Uchiyama et al. ............ 382/291 |
| 2005/0027186 A1 * | 2/2005 | Chen et al. ..................... 600/407 |
| 2005/0285879 A1 * | 12/2005 | Suzuki et al. ................. 345/633 |
| 2007/0094299 A1 * | 4/2007 | le Masne de Chermont . 707/102 |
| 2007/0247393 A1 * | 10/2007 | Kuroki et al. ..................... 345/8 |
| 2007/0273644 A1 * | 11/2007 | Mondine Natucci ......... 345/156 |
| 2008/0143895 A1 | 6/2008 | Peterka et al. |
| 2008/0150735 A1 * | 6/2008 | Celauro ......................... 340/584 |
| 2008/0218515 A1 * | 9/2008 | Fukushima et al. ........... 345/424 |
| 2009/0322671 A1 * | 12/2009 | Scott et al. .................... 345/156 |
| 2010/0134601 A1 * | 6/2010 | Lefevre et al. .................. 348/51 |
| 2011/0060557 A1 * | 3/2011 | De Pasca et al. .................. 703/1 |
| 2011/0164163 A1 * | 7/2011 | Bilbrey et al. ............ 348/333.01 |
| 2011/0171612 A1 * | 7/2011 | Gelinske et al. ................ 434/35 |
| 2012/0007852 A1 * | 1/2012 | Morate et al. ................. 345/419 |
| 2012/0081365 A1 * | 4/2012 | Nakagawa .................... 345/419 |
| 2012/0173210 A1 * | 7/2012 | Schmidt-Schaffer et al. .... 703/1 |
| 2012/0303336 A1 * | 11/2012 | Becker et al. ..................... 703/1 |
| 2013/0035906 A1 * | 2/2013 | Schmidt-Schaffer et al. .... 703/1 |
| 2013/0066602 A1 * | 3/2013 | Schmidt-Schaffer et al. .... 703/1 |

OTHER PUBLICATIONS

Milgram, P et al., A Taxonomy of Mixed Reality Visual Displays, IEICE Transactions on Information Systems, Dec. 12, 1994, pp. 1321-1329, vol. E77-D, No. 12.

Webel, S et al., Identifying differences between CAD and physical mock-ups using AR, 6th IEEE and ACM International Symposium , Mar. 6, 2007, pp. 281-282, Fraunhofer IGD, Darmstadt, Germany.

Becker, B et al., Utilizing RFIDs for Location Aware Computing, Ubiquitus Intelligence and Computing, Jun. 23, 2008, pp. 216-228, Springer, Berlin, Germany.

Virtual Research Systems, Window VR [online]. [retrieved on Sep. 17, 2012]. Retrieved from Internet: <URL: http://www.virtualresearch.com/products/win_vr.html>.

German Patent Office, German Office Action dated Jul. 8, 2013 for German Patent Application No. 10 2009 058 802.7.

* cited by examiner

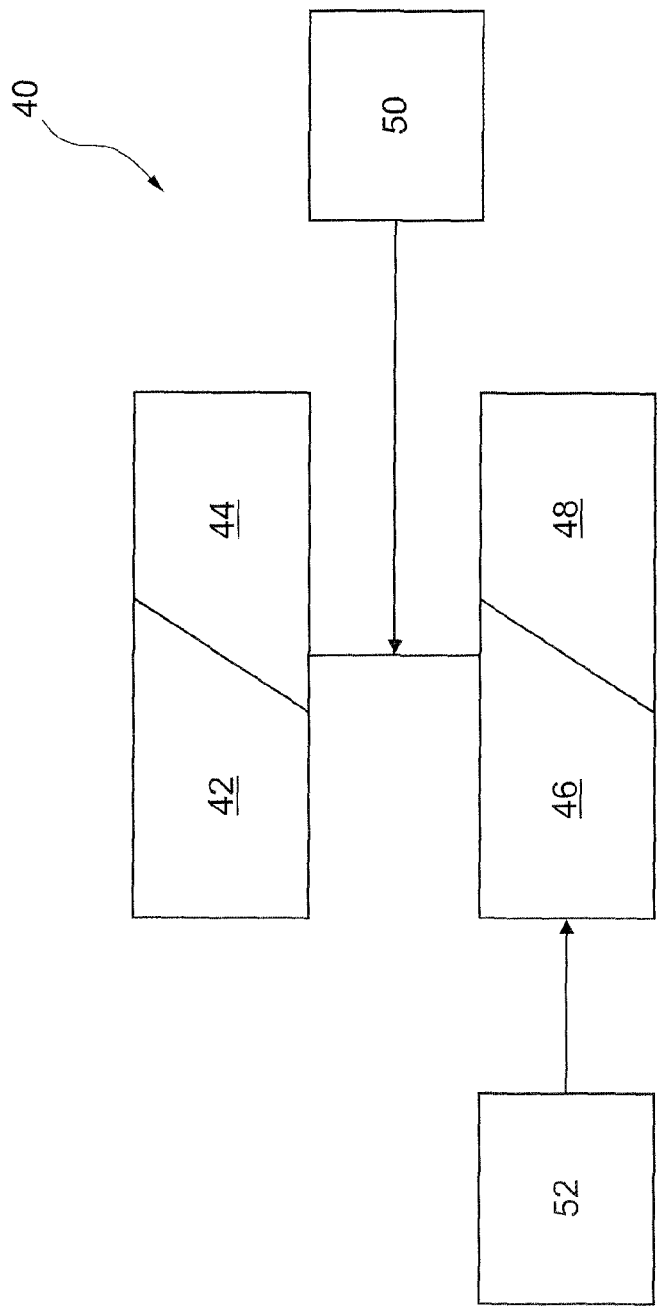

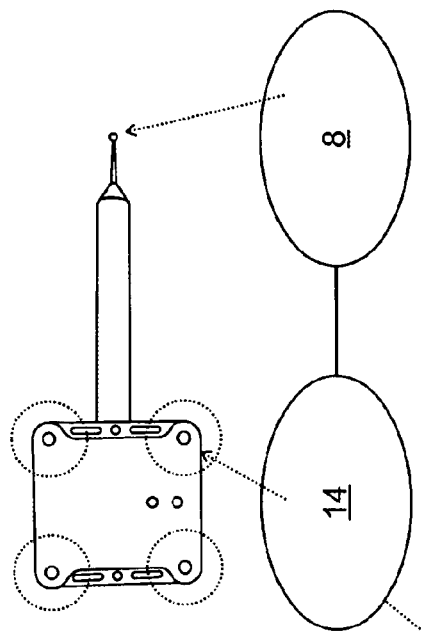
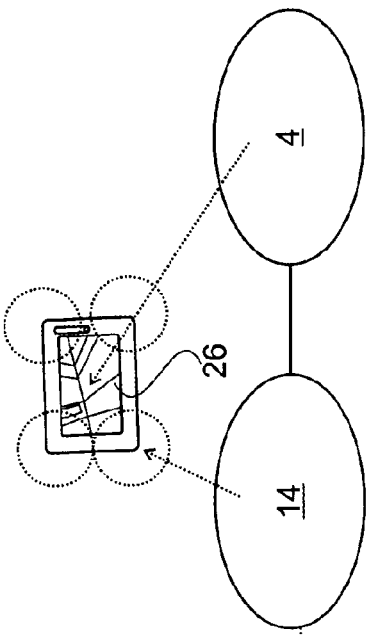
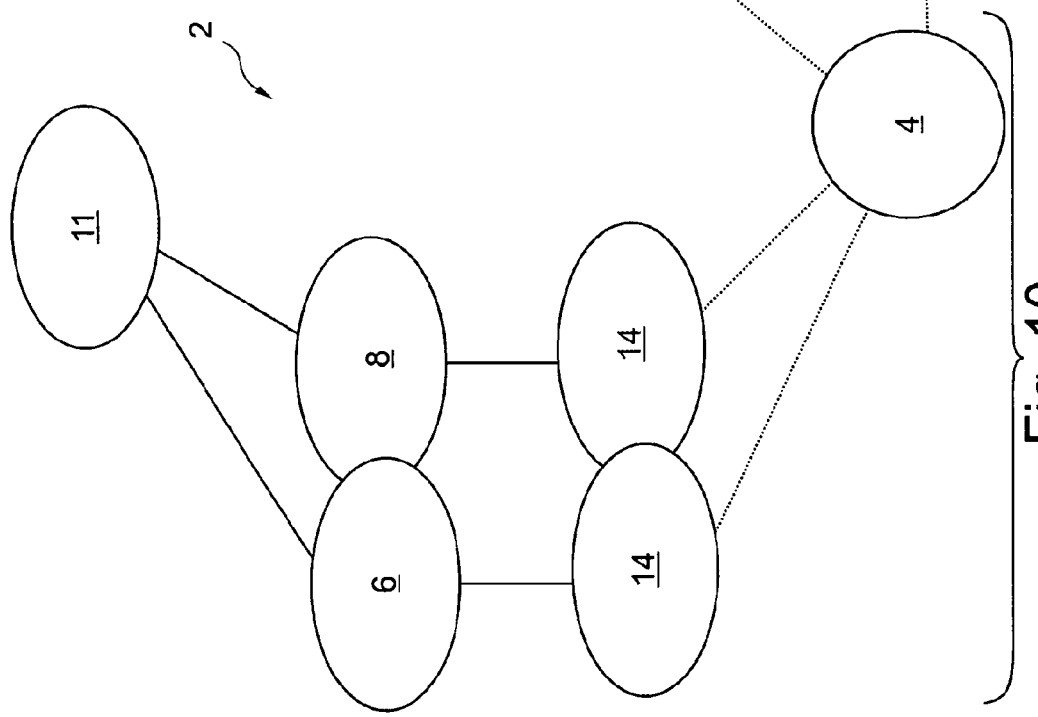
Fig. 10

ASSEMBLY AND METHOD FOR VERIFYING A REAL MODEL USING A VIRTUAL MODEL AND USE IN AIRCRAFT CONSTRUCTION

CROSS-REFERENCE TO RELATED APPLICATIONS

This is a continuation of International Application No. PCT/EP2010/070155, filed Dec. 17, 2010, which application claims priority to German Application No. 10 2009 058 802.7, filed on Dec. 18, 2009, which are hereby incorporated by reference in their entirety.

TECHNICAL FIELD

The technical field relates to a mixed reality application. In particular, the present disclosure relates to an arrangement for the combined display of a real and a virtual model, a method for simulating a virtual model in the context of a real model, and the use of an arrangement according to the present disclosure for a means of transport, in particular for an aircraft. In particular, the present disclosure relates to safeguarding product development, which is carried out in a real and a virtual manner simultaneously, on the basis of harmonised tools. The present disclosure also relates to an arrangement and a method for verifying a real model by using a virtual model and to the use thereof in aircraft construction.

BACKGROUND

In the context of planning and creating a preliminary design and ultimately implementing a new product, real reference models, that is to say a real, physical image or a physically created new product, but also an environment in which the product is subsequently to be used may be used for safeguarding a virtual product throughout the product lifecycle in terms of development, manufacture and maintenance. Thus, for example, in the case of a new development of an aircraft passenger seat, a physical reference model of a virtual seat model which is produced by a CAD application may be provided. On the other hand, for example, at least one section of an aircraft cabin may be provided for testing any capacity for integration or operation. However, because the product is not ready for production, for example in an early planning stage of a new product, adaptations and improvements to the real model may be required, and may ultimately lead to significant differences between individual models or sub-models, both real and virtual. In addition, other objects, desirable features and characteristics will become apparent from the subsequent summary and detailed description, and the appended claims, taken in conjunction with the accompanying drawings and this background.

SUMMARY

In the case of an aircraft, customisation may be managed for example by way of a set of modifications to a standard aircraft. To be approved, the resulting aircraft have to correspond closely to the digital mock-up. The field of use may thus extend beyond product development into manufacture, quality assurance and certification.

Also, if required because of high technical complexity or variability of a product which is to be created, differences between individual sub-systems may already occur in the virtual design stage, for example in a computer-aided planning phase. In the case of aircraft development, sub-systems of this type may for example relate to aircraft systems, the aircraft structure, or the aircraft cabin or cockpit. In one example, the wiring and the corresponding mounting systems can often be problematic in an aircraft, since they may be affected the most strongly by customisation. A prototype configuration of a reference model may thus be created as a replica, and can thus make appraisal possible between alternative product configurations.

A protocolled calibration between a real and a virtual model may become more difficult as a result of the generally spatial and physical separation of information between the real and virtual model. It can thus be seen that there is a need to provide improved calibration between a real and a virtual model.

The present disclosure can provide a solution which can provide an improved interface between a real model and a virtual model. In addition, during product development, a plurality of spatially assignable data can be called up directly on site. A solution of this type is provided by an arrangement for the combined display of a real and a virtual model, a method for simulating a virtual model in the context of a real model, and the use of an arrangement for the combined display of a real and a virtual model according to the present disclosure for a means of transport, for an aircraft.

According to various aspects, the present disclosure provides a non-static, interactive application in the field of augmented reality or mixed reality. In this context, it is advantageous to use a visualisation device, for example a mobile or portable computer, PDA or the like, which is capable of visualising or displaying even complex contents, for example as a two-dimensional, three-dimensional or quasi-three-dimensional image of a graphic. In this context, it is advantageous for the virtual model to be mixed with or superposed on a real model and for the virtual model to be embedded in the context of a real model. Mixed and augmented reality can be represented on a continuum, which describes a continuous transition between real and virtual.

Overlaying of this type, for example of a virtual product, that is to say a product which at a given point in time may exist as a computer-generated simulation of the planned product, may for example be carried out in the context of a real model, for example an image of the real model which is recorded using an information recording device such as a photo or video camera.

Further, superposition of the real and virtual model may for example be provided using a head-mounted display, which for example is capable of overlaying the contents of the virtual model directly on the eye of an observer, in a manner adapted to a real model which is under consideration.

Calibrating a planning state, for example of a virtual model, to the actual state, for example of a real model, may be found to be advantageous in both directions. On the one hand, a real model may be verified or adapted by way of a virtual model; on the other hand, changes or parameters which are carried out directly in the real model may be detected and recorded and transferred directly into the virtual model. Possible tools or elements for recording measurement values or parameters of the real model may pass these on to the virtual model in a referenced or defined manner, and thus directly influence, alter or adapt said virtual model.

Possible elements in this context are callipers for position determination, chromatometers and brightness meters. Further, in the field of data gloves or finger tracking and full body tracking, it is also possible to monitor operation sequences so as accordingly to compare them automatically with the planned sequences. Further, it may also be possible to have real tools, for example spanners and the like, detected by the system, and accordingly to monitor the work sequences and the tools which are used, for example for training and error detection in the real construction processes. Callipers may comprise one or more buttons for triggering actions; a photo camera may be used for example to transfer image information, for example in a georeferenced manner, into the virtual model. The camera may in this context be detected as a real/virtual tool of the position determination device. When the camera is triggered, a real photo and a virtual screenshot for example—having the same camera parameters, intrinsically for example focus and focal width, extrinsically position and orientation—may be recorded, and thus georeferenced, in such a way that they can subsequently be calibrated accordingly.

Motion capture suits may be used so as to transfer people and their movements and interactions with the product into the virtual model. Analogously, this is also possible in reverse; for example, purely virtual recording or computer generation with feedback into the mixed reality environment. A 3D scanning process may be combined with a position determining element so as to be able to follow the visual calibration of 3D data directly. A position-dependent reading device, for example for barcodes or RFID, may determine context-sensitive product data from other sources. An identical tool in the real and the virtual model makes it possible to select and evaluate meta-information both in the virtual and in the real world. Annotation tools may place observations, for example text, sound or image/video elements, in the virtual world. An identical tool, for example a loudspeaker system or a video projection system, may be used so as also to make this possible in the real model. This may for example make it possible to prepare errors/actions for subsequent operations. Integration of tools may generally be used, for example connecting drilling tools, for example, in the real and the virtual space, so as to make it possible to analyse construction feasibility. The corresponding instruments or tools may in this context be implemented in the virtual model, with an operation which is identical to or connected to that in the real model.

As an application-based aspect of the present disclosure, the virtual image of real tools may be seen in the context of the virtual model. Thus, complex product configurations may be safeguarded using a combination of a real, if appropriate validated model with virtual components. In this context, a data model may be used, and makes it possible to use the virtual product or virtual model in the direct physical context of a real model, for example using a computer to visualise the virtual model. The real model may in this context correspond to a replica of the virtual model, for example represent a prototype of the virtual model, or may instead for example correspond to an environment in which the virtual model is to be used as a subsequent real product.

Further, according to various aspects, a dynamic configuration of the virtual model is possible, for example on the basis of different configurations, which are stored in a product data management system, of a virtual model or of the real replica. Thus, for example, different implementations of a product may be changed or adapted in the short term in the context of different virtual models, and can thus be embedded in the context of the real model by superposing mapping. A further typical task of the product predevelopment involves manufacturing tolerances. In this context, it must be verified whether the operation is restricted within the defined tolerance of the manufacture. Examples are sections which may be distorted and thus affect the components of all of the other systems. In one example, aircraft wings may also be considered, since they twist/bend in defined regions in flight. Thus, the solution space which is to be analysed is not defined purely by the product configuration.

Thus, images of product variants or model variants and the possible configurations thereof may be mapped in connection with the real model of a sub-configuration, that is to say a partial adaptation, so as to safeguard alternative variants, and in this context provide a comparison with existing, previously safeguarded configurations. Degrees of freedom are defined in the product development so as to achieve various use scenarios and thus client groups. Since on the one hand products are becoming more modular, but on the other hand the degree of personalisation and customisation is also increasingly continuously not only in the field of aviation and aerospace, it may be clarified which production configuration and which product options may accordingly be selected together. Modularisation in aircraft construction should have as little influence as possible on the performance data, for example, the weight of an aircraft. Thus, it may not simply be possible to oversize everything so as to cover the wide range of options.

Product information of models can be embedded in the context of the real reference model from various database systems, for example a product data management system (PDM), product life-cycle management system (PLM) or SAP.

By means of a comparison, for example by measurement or parameter determination, product information can be protocolled, annotated or altered, and these changes can be fed back into the virtual model or into the associated database thereof.

Different measurement methods for verifying or determining individual product parameters may be used in the virtual and in the real reference model, for example position, dimensioning, colour, brightness and operation of a product or model. Thus, the dimensioning of a virtual and a real model can be compared, and possible differences can be protocolled and if appropriate simultaneously used for interactive adaptation of a virtual model, using a real calliper and a virtual calliper.

Thus, a real calliper may be used for visual calibration of characteristic values in the real and the virtual model. Thus, a harmonised tool may be used for the virtual and the real product, both as a real tool in the real model and as a virtual tool in the virtual model. Thus, it may for example be possible to dimension a virtual object with the same calliper on the visual terminal.

Further, differences or deltas in the target value and the actual value between the real model and the virtual model can be displayed, for example position or orientation differences, size differences or for example brightness or colour differences. The combination of a virtual and a real measuring element, for example a calliper, may make a numerical comparison possible. Exact protocolling of differences between the real and the virtual model may also be carried out, for example for a tolerance analysis or even for certification. In this way, an interactive interface is provided between the virtual model and the real model.

It is also conceivable for example to use the colour of part of a real model so as to carry out a corresponding alteration to the virtual model. Thus, integrated interaction between the real model and the virtual model is possible and can be implemented.

Further, it may be possible to integrate a human into a real or virtual product development. Thus, a virtual product may be ergonomically safeguarded using a virtual human model. On the other hand, real reference models may be ergonomically safeguarded using real testers, for example in relation to construction feasibility and for training and training control.

Virtual analysis results can in this context be integrated into a real model; equally, the reverse integration of real analysis results into a virtual model is possible.

Further, real prototypes may be checked or verified using a virtual human model; on the other hand, a virtual model or product may be superposed on an image of a real tester, so as to be able to verify the virtual model in this context.

In this context, position determination in a defined space is advantageous. In this context, a real space, that is to say the real model, may be provided with a real coordinate system. A real coordinate system may be understood to the effect that it should be possible to assign a defined coordinate or reference value to each item or point or location in the real model.

Likewise, the virtual model may comprise a virtual coordinate system, which makes possible unique referencing of elements or locations in the virtual model. The real coordinate system and the virtual coordinate system are generally substantially identical, so as to make simple superposition or conversion and position comparison possible between the real model and the virtual model.

In this context, the coordinate basis of a tracking system may be calibrated to a coordinate system of the real model, so as to form a basis for a high-precision image. In this context, calibration may comprise the calibration or definition of measuring positions, in the case of previously addressed measuring elements or tools, and the calibration of visualisation devices or display devices, which can make possible visualisation of the virtual model or superposed visualisation of the real model and the virtual model, in relation to the viewing window thereof and the viewing angle or direction in space. A visualisation device of this type may thus be understood as being a "window" into the virtual model using the reference basis of the real model.

It is further possible according to various aspects to implement a virtual tool in the virtual model, for example so as to provide direct comparisons between measurement values of the real model and the virtual model and thus to provide a prediction as to possible differences using comparable operation modalities.

Thus for example position detection may be carried out using a calliper in the real space. A calliper of this type may comprise a pointed tip which is referenced in terms of the coordinate system of the real space. Thus, a position may be provided for example by simply applying the referenced tip of the calliper to the point or position which is to be calibrated. Further, a chromatometer or spectrometer or even a brightness meter for lux or lumen may be conceivable. In this context, all of the tools are portable, and can thus be carried and operated by one person. Full body tracking or else finger tracking may also be carried out so as to be able to detect movements or interactions in the real space and transfer these for example into the virtual model. In this case, the movement itself is detectable as well as the arrangement and orientation thereof in space. Further, combination tools for an operation relating to a sequence or state are possible. A calliper comprising an input element is an example of a combination tool. Inputting data, for example annotations, status reports or photos, is also possible.

The real tools may, as set out above, also comprise a virtual pendant in the virtual model. Thus, position detection by way of a selection beam or pick ray or by calliper may be possible, and simultaneously provides a simple option for correcting a detected or captured position. Further, measurement values may be detected or determined on the basis of a selected position, for example for determining a colour value or brightness. Images of humans or virtual testers, an associated movement in or interaction with the virtual scene of a virtual model, for controlling product operations in relation to kinematics and animation, that is to say the movement sequence of the control process, are possible.

For an implementation of this type of a virtual model in a real model, a portable computer or display or PDA may for example be used, on which at least the virtual information or the virtual model can be displayed, or else on which a shared image of the real model and the superposed virtual model can be displayed. Processes and products from the field of wearable computing may make it possible to adapt and integrate imaging technologies for humans or for a virtual model. Further, for example a head-mounted display unit having a transparency function may be used, which makes it possible to project information in front of the field of view or directly into the eye of an observer in a manner referenced to the coordinate system of the virtual model and/or the real model.

An information recording device, for example a camera, generally arranged directly on the visualisation device which provides the image, may be used on the one hand for detecting image information for documentation purposes, and on the other hand for recording the real model for superposition with the virtual model. In this context, a 3D construction may also be possible. This reconstruction may also be possible in a camera-based manner, for example using photogrammetry or a 3D time-of-flight camera. Alternatively, an integrated laser scanner may be used, and the position thereof may also be detected in a time-synchronised manner.

For displaying, implementing and/or calibration between the real model and the virtual model, a connection may for example be provided to a product data management system or to a product life-cycle management system, which makes automated or manual readout or addition of data possible. Thus, integration into a business infrastructure is possible. In this way, it may also be possible to use generic product information for assigning various data to individual products or product parts which are implemented in the virtual and/or in the real model.

A virtual product model which is defined as completely as possible may thus be imaged and linked in, in an optimised manner, for calibration of the virtual model and the real model. An integration platform may make it possible to connect different product information from possibly individual, separate, linked databases. Configuration systems may further generate, in an automated manner, a virtual model and modifications or developments which are to be evaluated for this purpose.

A corresponding transfer from the real model into the virtual model may further make it possible to use an ergonomic human model, for example Ramsis or Jack. Real movement sequences can be transferred into the virtual model by linking in a calibrated motion capture system. Movement data which are recorded in the virtual model may be analysed and played back so as to analyse operations and ergonomic aspects, such as accessibility of items or loads. A combination of a virtual human model and a real human or user may make a continuous transition of an ergonomic safeguard possible between the real and the virtual model. Application-specific and/or tool-based evaluation possibilities in relation to captured data may thus be provided. Further, in this way, the transferability of results, for example, measurement results, between the real and the virtual model can be ensured. Thus, quality control of a virtually developed product can be carried out in a virtual model by means of a physical, real reference model. Complex product configurations may be safeguarded using a combination of a real, possibly already validated model and new, virtual components. Further, location-based provision, updating and annotation of product or component information are possible by linking the real context and the virtual model. Operating processes may be protocolled by way of a direct combination of real and virtual analysis results. In this way, results, for example, measurement results, can be fed back into the digital, virtual model in a simple manner. In this way, a verification of a digital, virtual model is ensured by means of a direct calibration of the virtual model with a real model.

A system or an arrangement according to the present disclosure may further be used for example in the field of training. For example, operation or movement sequences which are provided by way of defined operating instructions can be protocolled and evaluated in comparison with the provided instructions.

Further, with an arrangement according to the present disclosure, the construction or maintenance feasibility of a product can be evaluated. Thus, assembly or disassembly analyses or ergonomic analyses may be carried out. Data may also be stored so as to be reused or compared at a later point in time. A validated calibration between the real model and the virtual model may further make analyses of different product specifications possible by way of a reference model. It may equally be possible to evaluate planned operation or movement sequences. A comparison of target and actual values or visibility analyses on a simplified real model with a completely defined virtual model, for safeguarding certification-related details such as warning signs and inscriptions, may make possible or at least facilitate certification in accordance with FAA or JAA requirements.

The possibility of configuring a model, for example in accordance with a product catalogue, colour and trim or surface check, may be provided by integrating the entire configuration space, which may be overlaid, using the virtual model, on the real reference model having a standard configuration. In other words, colour combinations for example which are available for an object or part of an object may be overlaid as a virtual model on a combined overall view so as to provide an associated surface, which is for example kept white, of the element in the real model with a configurable colour.

It may thus be possible to safeguard a wide range of configuration properties, such as arrangement and resulting sense of space and colour and brightness perception. Further, the operability of a model may be dealt with in relation to ergonomics, functional safeguarding and readability. Basic functionalities of individual product groups may be validated within the real and/or the virtual model, for example operations such as "open door", "adjust seat" and "load hat-rack".

So as to make it possible to superpose a real model and a virtual model, it may be necessary to place the virtual model and the real model in a spatial relationship with one another, possibly to provide them both on a mutually adapted spatial information basis. Since the virtual model may generally already be provided with its own coordinate or reference system on the basis of computer-aided planning or production, it may be desirable to place this virtual coordinate system in a relationship with a real model or the real coordinate system. It may thus be necessary to provide 3D position determination in the real model and to use a position determined therein to orientate the virtual model.

So as to record an image of the real model, for example by using a camera, so as to be able to superpose it with a virtual sub-model, it may be necessary to determine the position and/or orientation of a visualisation device, which may for example be used for the superposed display of the real and the virtual model, in the real model or in the space of a real model. In this context, a first position determination element, for example an arrangement of markers, for example infra-red markers, which are passively irradiated or can actively radiate, can be applied on the visualisation device in a defined manner. Any marker technology which makes it possible to detect a spatial position or orientation with the required precision may be used in this context. An optical system may in this context represent an alternative, but other technologies may also be used, for example ultrasound, magnetic technologies or even a combination of technologies of this type. A position determination device, for example placed in the space of the real model, may thus initially establish a position of the visualisation device relative to the position determination device. In this context, the position determination device may itself determine the position of a position determination element or the orientation thereof, or however may provide means so as to make it possible for a position determination element to determine the position thereof in absolute or relative terms. If the relationship in space, that is to say the position and/or orientation, of the position determination element and thus of the visualisation device relative to the position determination device is established, it can be possible by means of a further position determination element, which is in a fixed relationship to the real model, to specify a reference of the position and/or orientation of the real model in relation to the position determination device.

This may be possible for example by applying a second position determination element to the real model. In this context, it may be desirable for the real model to be intrinsically compact and invariable, that is to say to have zero degrees of freedom, so as to prevent a potentially undetectable displacement between the second position determination element and the position determination device. It may also be desirable to apply an individual position determination element to each movable element of a real model, it being possible for said elements to be detectable mutually independently, so as to establish the respective position and/or orientation of the element of the real model in relation to the position determination device. On the other hand, provided that an intrinsically compact real model, which is as invariable as possible, can be arranged in a fixed relationship to the position determination device, it may not be necessary to provide elements of the real model with position determination elements permanently or at least for a relatively long time; it may instead be sufficient to display defined points of the real model in the space of the position determination device, so as to produce a relationship between the real model and the position determination device. It may thus be sufficient to fix a given element in space in a defined manner using three unique points, which are conveyed to a position determination device using a second position determination element, for example. More than three defined points may increase the precision and robustness of detection in space.

By way of example, suppose that an application of the arrangement for the combined display of a real and a virtual model according to the present disclosure is displayed in an aircraft. The real model includes for example a passenger seat group, for example comprising three seats. The virtual model includes a comparable arrangement, which for example can be coloured in in a defined manner, so as to draw attention to different configuration possibilities of a seat group of this type.

The position determination device is now constructed in space in such a way that a physical space—in which the real model, that is to say the seat group, is located—is exposed so as to be detectable. So as now to produce a relationship between the real model and the position determination device, six defined points for example, for example the centre of each backrest and the centre of each seat bottom, may be displayed. These are generally applied with high precision to the real model, so as to make it possible to determine the point in a simple manner.

By using a second position determination element, these points of the position determination device are displayed and are detected by said device. In this case, it may be irrelevant to what extent the position determination device actually receives information from the physical configuration of the real model. At the current point in time, it may be sufficient to display a relationship between the position determination device and each of the points in space which are to be detected. In this way, a relative position between the real model and the position determination device is established in a defined manner.

Further, by using a visualisation device, a virtual model is displayed. The visualisation device comprises a first position determination element, and as a result, a defined position and orientation of the visualisation device in relation to the position determination device can be detected. The virtual model may now also comprise or have defined the same, identical points, but in this case virtually, which were previously displayed using the second position determination element of the position determination device. Thus, on the one hand a relationship of the real model to the position determination device is established, and also of the determination device to the first position determination element and thus to the visualisation device. On the basis of the reference points which are known in the visualisation device, it is now possible to superpose the real model and the virtual model in the visualisation device.

An information recording device, for example a camera, which is also applied on the visualisation device in a defined manner and has a defined orientation and a viewing angle or a focal width, may record an image for example of the real model and display it on the visualisation device. On the basis of the referenced relationships of the virtual model and the real model, the image of the real model may now be superposed at least in part by the virtual model. For example, a white-coloured model of a real passenger seat facility may thus be superposed by a differently coloured virtual model, in such a way that by using the visualisation device, a viewer is given an impression which corresponds to a coloured real model which is imaged on the visualisation device.

On the basis of the superposition of the real model and the virtual model, for example by changing the configuration of the virtual model, the colouration of the real seat facility may thus be changed in the image of the visualisation device.

The virtual model and the real model may be coupled time-synchronously; there may thus be temporal synchrony between the real and the virtual at any time. That is to say, a measurement in the real model may be available substantially at the same time in the virtual model, that is to say the measurement value of the real measurement has been taken on the one hand and transmitted into the virtual model on the other hand. If substantially simultaneous availability is not provided, compensation of a latency may be required. If for example a measurement point in the real model is set and an associated operation, for example the position determination, is triggered, it may be necessary to ensure that the position of the measuring sensor is used in the virtual model at the moment of the triggering.

One of various exemplary aspects of the present disclosure may thus be integration of tools both in the real and in the virtual space. A selective combination of real tools and virtual tools represents decisive progress. The highlighted possibilities of use are also in combination with the tools.

A tool element may be a second position determination element, or it may be possible to apply the second position determination element to a tool element, for example, to arrange or attach it in a defined manner.

A further exemplary aspect of the present disclosure may be an arrangement for the combined display of a real and a virtual model, comprising a real model which has a real coordinate system, a virtual model, a visualisation device, a first position determination element and a position determination device. It may be possible to apply the first position determination element to the visualisation device, in which case it may be possible to determine a position and/or orientation of the first position determination element using the position determination device. The visualisation device may be arranged so as to display at least part of the virtual model, it being possible for the displayed part of the virtual model to be dependent on the position and/or orientation of the first position determination element. A position determination element, via which the determination of the position/orientation of the position determination device and the tools attached thereto is made possible in the real and the virtual model, may also be applied in the context of the real environment. This may be possible by way of identical coordinate systems and/or a known conversion rule, so as to map "real" space into "virtual" space or vice versa.

A further exemplary aspect of the present disclosure may be a method for simulating a virtual model in the context of a real model, comprising the providing a referenced real model, providing a referenced virtual model, and displaying the virtual model using the reference of the real model.

A logical or functional assignment of a real tool element and a virtual tool element may be understood as a link between the real tool element and the virtual tool element, in such a way that measurement values or parameters of a tool element of one model are linked to those of the other tool element of the other model, or they are assigned to one another. In this context, tool elements work substantially identically, in so far as a real tool element and a virtual tool element can work identically. It may also be possible for a virtual tool element to be controlled by a real tool element. It may thus be possible to embed or transfer a measurement value of one tool element substantially automatically into the context of the respective other tool element.

Mapping the operation of a real/virtual tool element onto the operation of a virtual/real tool element may be understood in such a way that a required or desired operation is implemented in a substantially identical manner, in so far as a real tool element and a virtual tool element can have substantially identical operations. Thus, for example, a real tool which may determine or display a position may implement the same operation in a logically or functionally assigned virtual tool element. In other words, the virtual tool element may likewise be arranged so as to display or determine a position, but in the respective other model, thus in this case in the virtual model. A virtual chromatometer may also determine a colour value of an element of the virtual model, and this colour value may be compared with the determined colour value of a real chromatometer.

An operation may be substantially identical in the virtual model and in the real model, or may at least logically correspond. For example, a real power drill also drills holes in the virtual model. For this purpose, the real power drill may be annotated with a drill point, vector and diameter in the virtual model. On the other hand, a virtual power drill may define an 8 mm hole in the virtual model. When the real tool is used, the drill type and the position and vector of the drill may moreover be verified and/or be shown for assistance.

In this way, parameters, that is to say degrees of freedom of the tool, may accordingly be mapped from real to virtual or from virtual to real. A precise operation or implementation may however be dependent on the currently required purpose of use.

The following exemplary embodiments of the present disclosure relate to an arrangement for the combined display of a real and a virtual model and to the method for simulating a virtual model in the context of a real model. However, exemplary embodiments of this type should not be taken to be limiting, but rather, the following exemplary embodiments apply to the arrangement, the method, and also the use of the arrangement.

In accordance with a further exemplary embodiment of the present disclosure, at least one operation of the real tool element may be mappable onto at least one operation of the virtual tool element and/or at least one operation of the virtual tool element may be mappable onto at least one operation of the real tool element.

Thus, a substantially identical operation may be carried out in the virtual and/or the real model, the result of the operation, for example detecting a measurement value or parameter, in one model being capable of influencing the respective other model.

In accordance with a further exemplary embodiment of the present disclosure, the at least one operation may be an operation from the group including determining position, orientation, manufacturing precision, colour value, brightness value, motion tracking, monitoring an operating sequence, and triggering an action.

The operation may be detected via various sensors, for example in relation to position, orientation and pressing a button for callipers or a power drill, and calibrated with the virtual instance. The operation may in this context be determined by means of the tool, for example a chromatometer, position measurement device or power drill, that is to say comprise a tool-specific operation. For example, a metal part which is operated on with a hammer in the real model is deformed in the virtual model. If a real car having a corresponding sensor system, for example acceleration and/or deformation, runs into an obstacle, a CAD model may be deformed or the virtual model may display corresponding damage. Both examples thus represent harmonised tools, and thus a true integrated real/virtual product development. The simulation in the virtual model may thus be coupled directly to the real properties and accordingly verified, for example in the case of a tool for counting people per emergency exit or for people tracking.

In general, parameters of this type, for example input and output, of tools are mapped between the real and the virtual, for example a calliper comprising a button, of which the button triggers a measurement, which measurement or information may further be transferred for measurement to a virtual/real counterpart system. With a tool, a user may thus trigger one or more actions, which subsequently lead to a corresponding reaction, which are both available in an identical or comparable form in the real and the virtual space.

In accordance with a further exemplary embodiment of the present disclosure, the position determination device may be arranged so as to determine the position and/or orientation of the first position determination element. As a result, a defined position and/or orientation of the first position determination element and thus of the visualisation device may be specified in a spatial portion for example of a real model.

In accordance with a further exemplary embodiment of the present disclosure, it may be possible to determine the position and/or orientation of the first position determination element in relation to the real coordinate system. As a result, it may be possible to specify a movement of the visualisation device in the space of the real model.

In accordance with a further exemplary embodiment of the present disclosure, the displayed part of the virtual model may be dependent on the position and/or orientation of the first position determination element in relation to the real coordinate system. It may thus be made possible to adapt a display of part of the virtual model dynamically during a movement of the visualisation device through the space of the real model.

In accordance with a further exemplary embodiment of the present disclosure, the arrangement may comprise a second position determination element, it being possible to arrange the second position determination element so as to establish a relationship of the real coordinate system with the first position determination element and/or the position determination device.

By using the second position determination element, the real model or the space of the real model can thus be referenced with the position determination device, and thus provide a known relationship to the real model and at least to the visualisation device.

In accordance with a further exemplary embodiment of the present disclosure, the visualisation device may comprise at least one element from the group including a memory element and a processor element, it being possible to arrange the at least one element so as to provide at least part of the virtual model for display.

In this way, the virtual model may be stored on the visualisation device so as to be displayed as required using a position or relationship relative to the real model. A processor element may provide calculations or reformattings which are necessary in this context of the model which is to be displayed, or may, for example, implement configuration operations.

In accordance with a further exemplary embodiment of the present disclosure, the visualisation device may comprise a communication element, it being possible, by using the communication element, to receive data on the position, orientation and/or part to be displayed of the virtual model.

Using a possibly bidirectional communication element, it may thus not be necessary to store information on the virtual model itself on the visualisation device. Thus, detection of the position and orientation may be independent of the visualisation device, which ultimately may receive information or data which are displayed on the visualisation device. Thus, instead of being visualised on a mobile terminal, information may instead for example be prepared on a central server, for example in real time. This may make it possible to use internal data processes and additionally to keep the requirements on the mobile device low. Further, it may be that locked abstract information is transferred in this manner, for example as a video stream, and it may not be necessary to transfer the 3D product data to a visualisation device. Further, this may increase the reliability of the application and for example make it possible to use WLAN.

In accordance with a further exemplary embodiment of the present disclosure, the visualisation device may comprise an information recording device, the information recording device being arranged so as to record at least part of the information of the real model. For example, the information recording device may be a photo or video camera, so as to record and display a video or photograph of the real model. It may subsequently be possible for this recording to be superposed at least in part by the virtual model, so as to convey an overall harmonised optical impression which includes the real and the virtual model.

In accordance with a further exemplary embodiment of the present disclosure, the visualisation device may be arranged so as to display at least part of the virtual model, in such a way that it can be superposed at least with a part of the recorded real model. In this way, a combined real/virtual model can be provided, and may on the one hand convey the impression of a real model, but on the other hand have the configuration possibilities of a flexible virtual model.

In accordance with a further exemplary embodiment of the present disclosure, the visualisation device may be arranged so as to be portable. In this way, simple displacement or travel through the real model may be possible for a user so as to consider a combined real/virtual model from various perspectives.

In accordance with a further exemplary embodiment of the present disclosure, a parameter of the real model may be detectable, it being possible to alter the virtual model using the parameter. Generally, a parameter of the virtual model may be alterable independently of the real model. A parameter of this type may for example be a position, an orientation, a colour, a brightness value, or even metadata.

A field of application of a mixed reality application may for example be found in the field of aircraft construction. In aircraft construction, or in general in large-scale projects which require a comparable degree of planning, such as vehicle construction in general or else even building construction, in the context of the planning, a complete three-dimensional reference model, known as a digital mock-up (DMU), therefore a virtual model, may be used, and is produced completely or in part by using 3D CAD development methods or software.

A mixed reality application according to the present disclosure may be used in aircraft production plants. In this case, three-dimensional master reference data (DMU) are generally available for the aircraft which are to be constructed. As a result, it is possible in the context of aircraft construction to draw a comparison between the planned version in accordance with the virtual model and the real implementation, that is to say the real construction of the aircraft in accordance with the provided planning data. In other words, a corresponding application may make it possible to compare the planning version (as planned) with the implemented, constructed version (as built) of an aircraft in a simple manner.

In this context, conventional measuring systems may for example use specific reference points, which are established in the virtual model in a planning stage, so as to check the production quality, in relation to manufacturing tolerances, of the real model. Corresponding reference points are generally fixedly incorporated in an aircraft. A corresponding measuring system may be operated as an offline process, in which individual measurement values are produced in the real model and subsequently compared with required specifications, for example from the planning model or the planning draft. A corresponding comparison with the virtual 3D reference model may for example take place on site in the aircraft using powerful workstation PCs, which are arranged so as to display the (complete) reference model. On the other hand, installation documents, for example in printed form or in digital form, may be provided on a corresponding display instrument, for example a PDA.

For example, for aircraft manufacturers who use 3D CAD software in aircraft design, it is generally a requirement that the ultimately produced product, that is to say the constructed aircraft (as built), corresponds to the planned model (as planned), in the context of the permitted tolerances. As a result, the aircraft which is actually produced should generally be an image of the digital mock-up.

The aircraft production distinguishes two main phases, the pre-FAL phase and the FAL phase (final assembly line). The pre-FAL phase is also referred to as the MCA phase (major component assembly), which in turn is subdivided into the construction of the aircraft structure and the installation of the aircraft systems, such as lines, ventilation pipes and further fitted components.

In the example of the system installation phase, an operator obtains a drawing or in general a draft which shows the components which are to be installed. This drawing may for example be produced from the digital mock-up or on the basis of the virtual model. This may be in the form of a 2D drawing, by way of a derivation from different perspectives, or else as an annotated 3D model in a digital construction support. The components which are to be used, for example clamps, brackets, outlets, pipes, or quite generally fitted components, and the position thereof in the aircraft, as planned in the reference model, can be taken from the drawing/model.

In this context, for example coordinates of an installation site are provided in relation to provided reference points. It may not always be possible to provide an orientation in an aircraft or in a main component which is located in the construction, for example a fuselage section, a wing section or the like, in a simple and/or precise manner. This may result in individual elements being installed incorrectly.

However, as an incorrect installation has to be corrected before manufacture, various further control phases for quality assurance have to be provided, and these phases check the spatial position and installation direction of installed elements. A corresponding check is generally carried out manually, again using 2D drawings or the 3D DMU of the virtual model. It can thus be seen that a corresponding quality assurance involves a considerable amount of work.

The present mixed reality application may provide simplified assistance in the initial application, in the installation of a component in an aircraft, or may equally simplify subsequent quality assurance steps.

The system according to the present disclosure may thus be used qualitatively (visualisation of the DMU) as well as quantitatively (measuring tip/calliper to check the component positioning in both the real and the digital model (DMU)).

Simplification may be provided by using a visualisation device which on the one hand "knows" its own position in the aircraft, and is thus capable of localising itself, and simultaneously provides position-dependent and/or orientation-dependent 2D or 3D information of the virtual model, for example to a user who thus obtains current information, in a position-dependent and/or orientation-dependent manner, on the components which are to be installed in the aircraft. It is further possible to display additional information; for example, the torque with which a screw connection has to be tightened so as to meet the necessary requirements may also be displayed. Ultimately, in this way virtual and interactive installation instruction can be provided.

By way of corresponding provision of visualised virtual model information, subsequent quality control may also be possible in a simplified manner. By means of the visualisation device, simplified access to the virtual model or the digital mock-up is made possible, in that an appropriate portion of the virtual model is displayed to a user, taking into account a position and/or orientation (pose) in the aircraft. Individual operation steps which are to be carried out can now equally be displayed, together with for example a list of components which are to be installed, the tools which are available or required for this purpose, and operation steps which are to be carried out.

Once a component has been installed, manual or automated quality control may be carried out by means of the visualisation device. The proper installation of the component may be recorded, for example marked as complete, in a global construction plan system which is incorporated into the arrangement, or else for example in a simple checklist. Using a corresponding visualisation device, an internal construction may for example be displayed in steps to a user, who simultaneously obtains detailed implementation instructions, and subsequently also makes it possible to check the completed action directly. Further possibilities have already been disclosed in the above.

In one example, at an exemplary moment in the production process of an aircraft, the visualisation device may provide a user with the installation of an element, for example a cable duct, as the next operation step which is to be carried out. In this context, the system may on the one hand display the required components to the user, for example the cable duct and fixing material, for example including component reference number and storage location. The user may further obtain information on the required tools for the installation, again possibly with a unique reference number and current storage location. The user may thus collect the required components for the installation and prepare them for installation in the aircraft.

The visualisation device may subsequently establish, manually or automatically, that the corresponding installation is due to begin. Operating instructions for the installation may be displayed on the visualisation device. In this context, some operation steps may be displayed in greater detail than others.

A user thus obtains explicit instructions for an exemplary operating sequence, as to what is to be installed, how, where and when. Once the installation is complete, quality control may take place directly by means of the visualisation device.

Quality control may take place in that a user uses a real tool element or a display device, which may equally be localised in space in relation to the aircraft structure and the visualisation device, so as to discover individual reference points or measurement points, and so as thus to be able to check whether required tolerances are met.

It is also possible that the visualisation device recognises the installed element itself, for example by recognising the shape of the element, for example by way of edge detection, for example by means of an information recording device, for example a camera, is capable of determining a corresponding position and/or orientation, and on the basis of a detected position and/or orientation may establish whether required tolerance specifications have been met. If installation has taken place correctly, a corresponding observation may be placed manually or automatically in an installation protocol. Methods which resort to a 3D camera, for example a time-of-flight camera, or laser scanners are also possible.

Thus, when an arrangement according to the present disclosure is used, the installation work may be reduced, and at the same time, the production quality may be increased. Tedious, possibly numerous quality control steps may also be carried out in a temporally optimised manner.

To make it possible to localise a visualisation device precisely or for the visualisation device to localise itself, in a structure, for example in the aircraft fuselage, which is currently under construction, a position determination element may be used, and is applied in a defined manner in or on the aircraft, and thus in or on the real model.

On the one hand, the position determination element may be applied in defined positions, which are for example already referenced in the virtual model, and thus produce a reference of a virtual coordinate system of a virtual model to a real coordinate system of a real model.

Alternatively, however, a position determination element may be applied substantially freely or as desired in the real model, but fixedly in relation to the real model, and subsequently be referenced in terms of the position thereof in the real model on the basis of the virtual model.

For example, the position determination element or reference marker may be applied on a part of the aircraft structure. On the one hand, the position determination element has components which may be identified for example by means of a visualisation device or else by means of a position determination device. At the same time, the position determination element may, especially in the second case, comprise reference points which make localisation possible in the real model and simultaneously in the virtual model. Thus, the virtual model may for example, temporarily, be supplemented with the exact position of the position determination element in the real model. If a defined position and/or orientation of the first position determination element is known both in the real model and in the virtual model, it is possible at the same time for the position and/or orientation of the visualisation device to be recognised in the real model and be provided simultaneously in the virtual model, for example by means of a visualisation device which is capable of detecting its own position and/or orientation in relation to the first position determination element.

Corresponding fixed application of a first position determination element on/in the real model may subsequently constitute a fixed reference point for a visualisation device for carrying out (self-)localisation in the real model as well as in the virtual model.

Both the real model and the virtual model may be broken down into different construction phases. Thus, for example, in the real model the fuselage structure may initially be constructed from individual elements, and subsequently for example insulation may be provided internally, on which cable lines, ventilation shafts etc. are further installed. Subsequently, a lining may for example be installed. The individual steps shown are shown in a simplified manner in this context. Various planning stages or virtual production stages may be available in the virtual model for the individual construction portions. For example, after all of the elements which are positioned between the insulation and the lining have been installed, the virtual model may be switched from a model state of this type, in which the intermediate elements are visible, to a further state, which may be used for the installation of the lining elements.

It is also possible that in a real construction of the virtual model, difficulties may occur which are not taken into account in the planning phase, and thus in the virtual model. In this context, the real model may be adapted, for example, in a manner deviating from the virtual model. These deviations may be recorded or detected, for example by means of the visualisation device or a real tool element, and reflected in to the virtual model. As a result, errors in the virtual model can be eliminated with reference to the real model, and said virtual model can be further optimised.

The real model and the virtual model ultimately have to correspond, in the context of specified production tolerances, and this is generally a prerequisite for a subsequent flight authorisation. For the application according to the present disclosure, a software system may be used which is arranged so as to provide the position of a visualisation device according to the present teachings in real time. This may for example provide a pre-recorded or detected (coordinate) transformation between the real model with the arranged position determination element and/or a transformation between the visualisation device and the position determination element.

In the following, referencing may be understood to be the process of determining the position of the position determination device in the aircraft, which may take place once so long as said position does not change. In the following, online registration may be understood to be when the registration can be determined independently during use, and thus the position determination device or the visualisation device may be moved so long as it comprises corresponding elements, for example an information recording device. This may increase the flexibility of the system or arrangement, since this means that said system or arrangement can react to impacts and shocks.

In the following, localisation of the visualisation device may be understood to be the general sequence for recognising it in the coordinate system of the real model, that is to say a sequence of aircraft→reference mark→registration→position detection system→visualisation device.

For corresponding localisation of the visualisation device, registration may also be required. This may be understood to be online registration, in that the position determination device may ultimately be configured as a mobile position determination device, which is not mounted statically, for example, is not fixed statically in relation to the first position determination element or the real model, but instead can vary its own position in the aircraft and may detect or calculate said position at any time. For this purpose, a reference marker, for example the first position determination element, may be arranged so as to be able to detect the visualisation device by means of the information recording device. A position determination device may also detect both the visualisation device and the first position determination element or reference marker, and determine a position in the real model by detecting the relationship between the visualisation device and the position determination element and calibrate said position with the virtual model.

The position determination device and/or visualisation device, if the latter comprises an information recording device, comprise what is known as an operative volume, which represents a volume in space in which a position determination element or a visualisation device may be arranged and may be detected by the position determination device or by the visualisation device by way of the information recording device. Once the detection is complete, that is to say when the position determination element or in general a marker or reference marker is present in the operative volume, a position and/or orientation in relation to the position determination element—and thus, by way of the known transformation between the position determination element and the aircraft, a position—may be established.

Different real tool elements may be detected and distinguished by the visualisation device. In this context, visual or electronic markers and/or individual position determination elements may be applied on a tool element, on the one hand for detecting the type of tool element, and on the other hand for determining the position and/or orientation thereof. By way of individual position determination elements on a tool element, a defined position in the real model may be provided for the respective tool using the visualisation device.

Individual tool elements may be known to the visualisation device. This may contain an operation, for example the operation of a power drill, or else the dimensions of the tool element, that is to say for example the tip of a drilling bit of the power drill and the orientation in space. In this way, it may for example be possible for assisted drilling to be carried out by means of the visualisation device, and thus be guided thereby. The visualisation device possesses for example information as to how a desired hole is to be placed in the real model. The visualisation device may thus display the point of the hole, and at the same time specify instructions for holding and/or operating a drill, in such a way that a required hole can be produced, and the implementation thereof can be simultaneously checked and if appropriate corrected, substantially exclusively by way of the specifications of the visualisation device.

Other applications or functions of tool elements may for example be checking a position, for example for detecting a manufacturing tolerance. A tool element may thus be in the form of a measuring probe or a checking tip, which can be used, on the basis of the knowledge of the position and orientation thereof in space, to display the positions of any desired objects or of specific measurement points in space, or else to measure distances between objects and thus check to what extent the virtual model and the real model correspond.

Further tool-component combinations are also possible, for example a screwing device, which tightens a screw in accordance with a specified torque. This information may be present or be stored in the virtual model. In this way, it should be possible to program a screwing device, which is logically linked to the arrangement, with the appropriate torque in accordance with the currently desired operation step, in such a way that when the actuation of the screwing device is complete, the user selects the desired torque substantially automatically. In this context, the user himself need not even necessarily be informed as to a torque specification.

The visualisation device may superpose the real and the virtual model, for example on a display. The real model may for example be recorded by way of the information recording device of the visualisation device and superposed with the virtual model on the display. In this context, the virtual model may not be shown in its entirety; for example, filtering procedures may be used, for example so as to map desired parts of the virtual model onto the real model image. In this way, it is possible for example exclusively to overlay cable ducts from the virtual model into the real model, and thus to verify a correct installation visually, by means of the visualisation device. A filtering option may also be implemented for context-sensitive information, for example the current validity of a component. This describes for example a point in time, a manufacturing location, a workplace, a responsible group of companies etc. at/by which a component is or may be constructed.

By comparison with conventional measurement systems or real time tracking systems, the arrangement according to the present disclosure provides increased flexibility, on the one hand as a result of its portability, and on the other hand because it is less susceptible for example to vibrations as a result of the fixed relation of the first position determination element to the real model. The arrangement according to the present teachings can thus be integrated seamlessly into the production process, for example of an aircraft. Because the position of a first position determination element is known in advance, time-consuming registration of the real model may be unnecessary. Measurement values may thus be determined without any delay, and the registration may accordingly be adapted substantially in real time.

In the context of the application of the arrangement according to the present disclosure, a setup phase and an operation phase may be distinguished. In the setup phase, adapters or reference markers for example a first position determination element, may be applied on the real model, that is to say on the aircraft. The position determination element or the reference markers are either already registered in the virtual model or the pose thereof in advance, or now have to be fixed in space in relation to the real model by means of known registration methods, so as to be able to produce a reference between the real model and the virtual model.

In this context, a position determination element may comprise at least three points or marker elements, which may be detected by way of the information recording device of a visualisation device or by means of a position determination device. This may typically take place at a single moment during the production phase of the aircraft. The first position determination element, or elements if the aircraft comprises a plurality of position determination elements of this type, may remain in the aircraft until the final manufacture, and thus not trigger any new registration.

Subsequently, the visualisation device is placed in the aircraft in such a way that reference markers or position determination elements are arranged in the operative volume thereof, and for example, a region corresponding to the region in which an operation is actually to be carried out is visible. This region is referred to as the "area of interest". In this context, the production process may now begin, computer-aided by the arrangement according to the present disclosure. The first position determination element(s), which are applied in/on the real model in a defined manner, may, for example, not be removed until the aircraft is in the finalised state. The position determination elements may subsequently be used for a further aircraft of the production.

The arrangement according to the present disclosure makes it possible, during operation, to measure coordinates and lengths directly in the manufacturing process. The registration is necessary once during the setup, and at this moment the first position determination elements are installed in the aircraft, that is to say in the real model.

In one exemplary embodiment, the markers are matched to the real model once, for example, to substantially the entirety of an aircraft, for example by laser measurement, and subsequently, while the system is in use, the visualisation device and/or real tool elements for example are registered relative to these markers.

The visualisation device thus represents a "viewing window" into the virtual model, and makes it possible to identify the location and the orientation of the visualisation device while simultaneously displaying a view of the digital model and for example installation drawings from the viewing angle of the position of the visualisation device. This may be of help to the user during the installation process, as well as for a subsequent quality check.

As a result, not only can a quantitative difference for example in an installation location be established, but rather, it is simultaneously possible to determine the absence of an entire element or incorrect installation of an element, for example as a result of incorrect orientation, by way of visual validation between the real and the virtual model.

The visualisation device may also have input elements, which make integrated error documentation possible, for example by way of information input or by recording images, for example by means of a camera, which may simultaneously constitute the information recording device. The images may also be georeferenced, on the basis of the real coordinate system of the real model. On the basis of the knowledge of the exact position and orientation and for example also the focal width of a camera, virtual objects may be inserted into the image of the real model of the visualisation device with the same perspective.

By means of the visualisation device, it is also possible to carry out length and position measurements in the virtual model, without necessarily having to prepare these in advance. Corresponding measurements can be reproduced directly on the real model and checked in the form of quantitative checking.

A person skilled in the art can gather other characteristics and advantages of the disclosure from the following description of exemplary embodiments that refers to the attached drawings, wherein the described exemplary embodiments should not be interpreted in a restrictive sense.

BRIEF DESCRIPTION OF THE DRAWINGS

The various embodiments will hereinafter be described in conjunction with the following drawing figures, wherein like numerals denote like elements, and wherein:

FIG. 6 shows an exemplary embodiment of a method for simulating a virtual model in the context of a real model;

FIG. 10, 10a, 10b are exemplary schematic drawings of the arrangement for verifying a real model by using a virtual model according to the present disclosure;

DETAILED DESCRIPTION

The following detailed description is merely exemplary in nature and is not intended to limit the present disclosure or the application and uses of the present disclosure. Furthermore, there is no intention to be bound by any theory presented in the preceding background or the following detailed description.

Figure 1A:
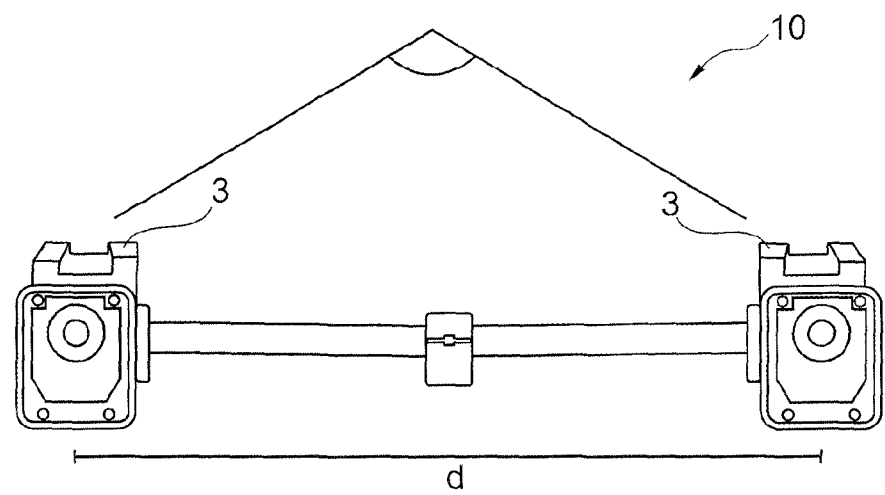
FIG. 1a, b show exemplary embodiments of a position determination device according to the present disclosure.

Reference is made to FIG. 1a, b, which show an exemplary embodiment of a position determination device according to the present disclosure.

FIG. 1a shows a position determination device 10, including two information recording devices, which in the present context are shown by way of example as infra-red camera elements 3. The two infra-red camera elements 3 are mounted together on a support, at a defined distance from one another and with a defined orientation relative to one another. By way of example, the distance between the two infra-red cameras 3 is d. The infra-red cameras 3 may be angled at an angle α to one another, or else may be mutually parallel, in which case α=90°. On the basis of an opening angle of each of the infra-red camera elements 3, these are each able to capture a funnel-shaped region, and these regions overlap at a short distance from each infra-red camera element 3. Thus, an element which is located in the overlap region of the cone-shaped recording region of each infra-red camera element 3 may be detected by both of the infra-red camera elements 3.

Figure 1B:
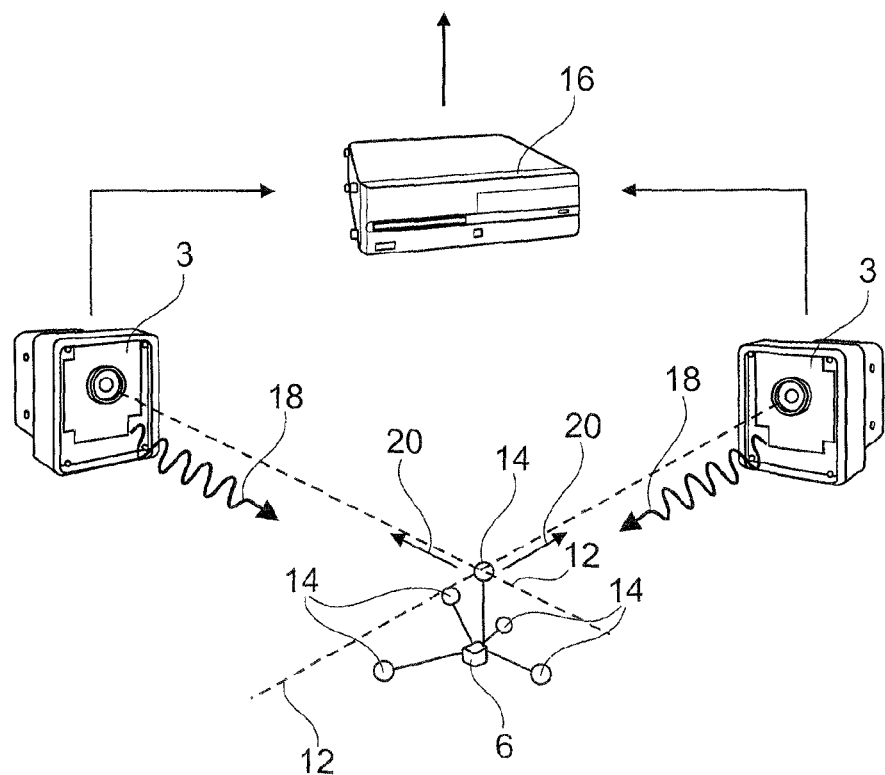

Reference is further made to FIG. 1b, which is a schematic drawing of the detection of a marker element. FIG. 1b shows by way of example a first position determination element 6. The position determination element 6 includes way of example of an arrangement of five markers 14, which are infra-red active or reflect infra-red light. The markers 14 are arranged on the first position determination element 6 so as to determine a defined orientation of the position determination element 6 in any desired space. An infra-red marker 14 is shown by way of example as being captured by both infra-red camera elements 3. Each infra-red camera element 3 transmits an infra-red illumination or an infra-red flash 18, which is thrown back towards the infra-red camera element 3 as reflected infra-red light 20 by the marker 14 which reflects infra-red light. Because of the defined spacing at a distance d and a defined relative angular arrangement a of the infra-red camera elements 3, a point in space can be determined relative to the position determination device 10 by using the marker 14. In this context, each infra-red camera element 3 is capable of determining an optical axis 12, the position of the marker 14 in space being represented as the point of intersection of the optical axes 12 or optical beams.

A determination of this type may be carried out substantially simultaneously in relation to each infra-red marker 14, resulting in a defined orientation and position in space of the first position determination element 6 by way of the plurality of infra-red markers 14 thereof. Because the geometric arrangement of the markers 14 or the configuration of the first position determination element 6 is known, it may thus be possible to determine a defined position in space.

It may further be possible to apply the first position determination element 6 in a defined manner on a further element, for example a visualisation device 4, making it possible, for known geometric dimensions and relationships, to determine the position and orientation of the further element in space. A determination of this type may for example be carried out by the computer system 16, which ultimately obtains two-dimensional image data from each infra-red camera element 6 and calculates the position of the first position determination element 6 in space from said data on the basis of the known, defined configuration of said element. The optical tracking system or the position determination device 10 may thus determine a position of individual markers 14 with high precision.

Figure 2:
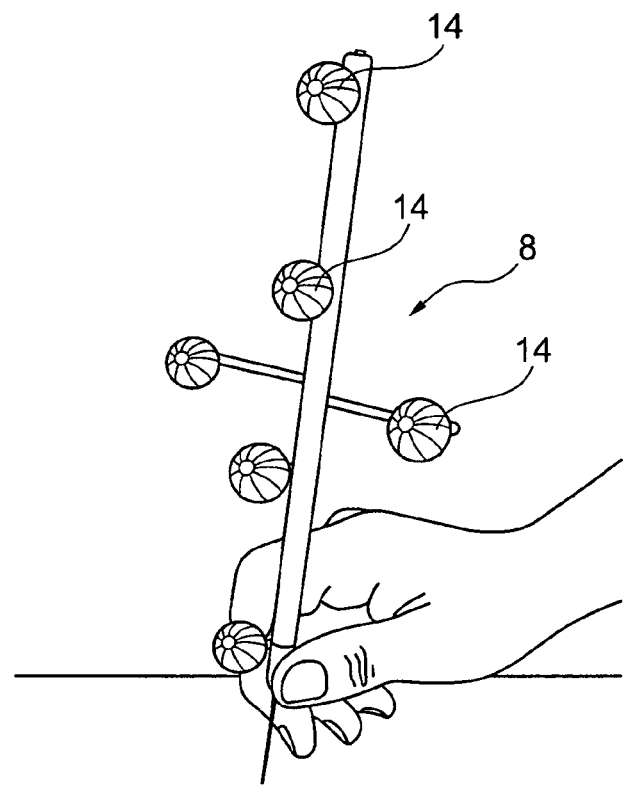
FIG. 2 shows an exemplary embodiment of a second position determination element according to the present disclosure.

Reference is further made to FIG. 2, which shows an exemplary embodiment of a second position determination element according to the present disclosure. In FIG. 2, the second position determination element 8, for example a sensing marker, carries by way of example six infra-red markers 14 having a defined spacing and orientation. The arrangement and orientation of the infra-red markers 14 in space thus makes it possible to fix in space, in a defined manner, a known geometric configuration of the second position determination element, for example the tip of the second position determination element. Thus, the tip of the second position determination element 8 may be used to display and reference individual points in an arrangement, for example in the real model. The second position determination element 8 further has an input option for highlighting or marking measured values, for example in the real and the virtual model at the same time. It may further be possible to apply a second position determination element 8 of this type on a further tool or element in a defined manner, so as to make it possible to reference the tool or element in a defined manner.

Figure 3:
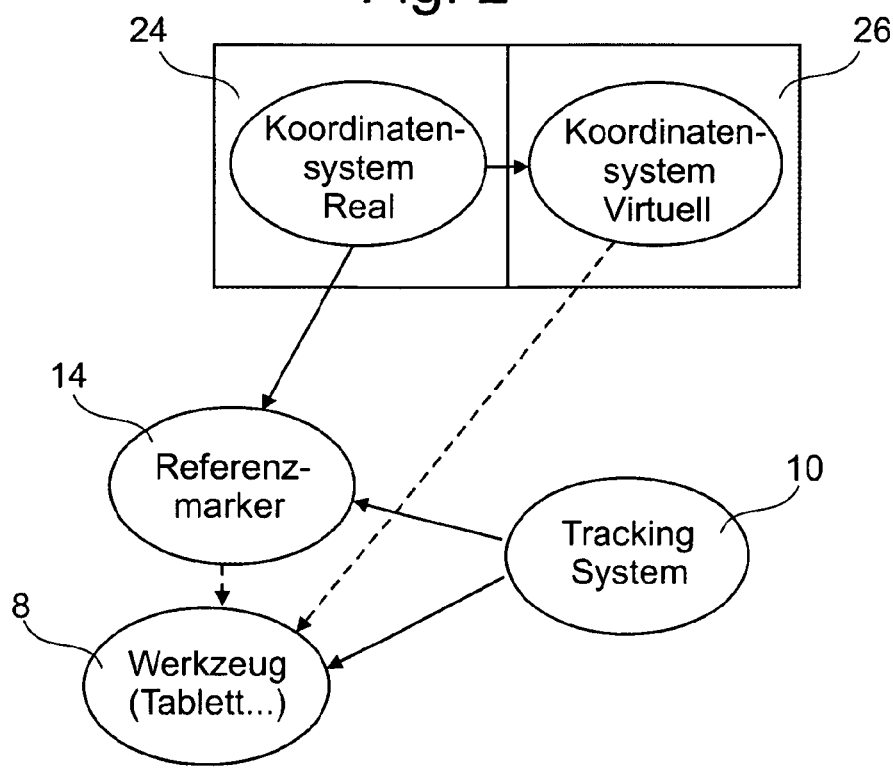
FIG. 3 shows an exemplary calibration of an arrangement for the combined display of a real and a virtual model according to the present disclosure.

Reference is further made to FIG. 3, which shows an exemplary calibration of an arrangement for the combined display of a real and a virtual model according to the present disclosure.

It can be required to produce a relationship between a real model 24 and a virtual model 26. For this purpose, it can be necessary to produce a relationship between the coordinate system of the real model and the coordinate system of the virtual model. A tracking system 16 is initially used so as to detect a position or orientation in space of a tool 8. The tool 8 is provided with markers 14 so as to make the detection possible. For example, the tool 8 according to FIG. 2 may be used, of which the tip can be assigned to a unique position and orientation, in relation to the arrangement of the markers 14 thereof, in a space, initially any desired space, which can be covered by the position determination device 10. Now, referencing or assignment can be provided between the real model 24 and the virtual mode 26, in such a way that for example identical reference points in the real model 24 and in the virtual model 26 are initiated and thus displayed. In the virtual model 26, this may be carried out with a virtual tool. Further, the virtual reference points may be provided, and thus dedicated display in the virtual model 26 may not be necessary. In the real model 24, the same reference points are now displayed for example with the referenced tip of a tool 8, in such a way that a relationship can now be produced between the space or between the real model 24 located therein in relation to the position determination device 14. In this case, it may be necessary for the position determination device 14, at least until a recalibration, to remain fixed in location in relation to the real model 24. It is also possible to provide the real model 24 itself with a first position determination element 6, for example to apply this in a fixed location on the real model. Thus, a relationship of the real model 24 to a first position determination element 8 may be established, and is independent of a relationship of the position determination device 14 to the real model 24. Thus, once the calibration is complete, the position determination device 14 may be displaced in space, without this influencing a known relationship of the real model 24 and the first position determination element 24. This is appropriate in the case of a rigid real model 24, which thus does not comprise any elements which are displaceable relative to one another. Alternatively, individual elements of the real model may each be provided individually with first position determination elements 6. In this case, it may be desirable to use different position determination elements 6, which can for example be individually detected and distinguished by the position determination device 10 or a computer system 16 which is connected thereto.

Figure 4A:
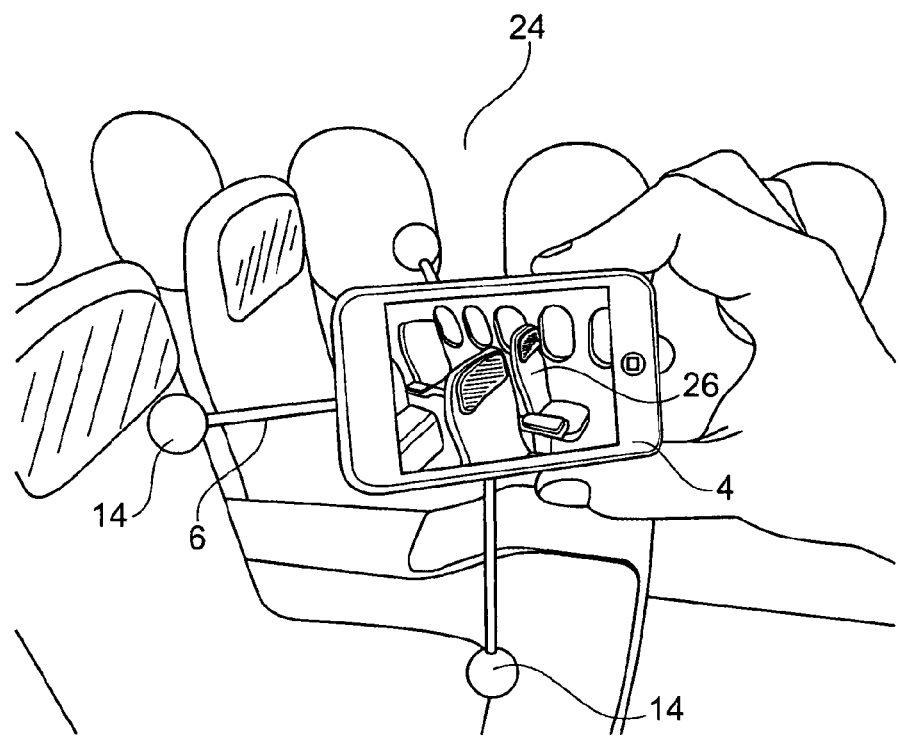
FIG. 4a, b show exemplary embodiments of a visualisation device according to the present disclosure.

Reference is further made to FIG. 4a, b, which show exemplary embodiments of a visualisation device according to the present disclosure. FIG. 4a shows by way of example a visualisation device 4 in the form of a personal digital assistant (PDA). The visualisation device 4 comprises, on the side remote from the viewer of the figure, an information recording device 28, for example a video camera. In the background of FIG. 4a, there is a real model 24, in this case by way of example an arrangement of a group of seats in an aircraft. The visualisation device 4 is provided with a plurality of markers 14, which together define a first position element 6, which is applied on the visualisation device 4 in a defined manner. A recording of the real model 24 by the information recording device 28 is shown on the display of the visualisation device 4, superposed with a virtual model 26. Various parameters may now be altered in the virtual model 26, for example the colouration of an element of the real model 24, and as a result, the overall impression of the virtual model 26 and the real model 24 can be adapted for a viewer.

Figure 4B:
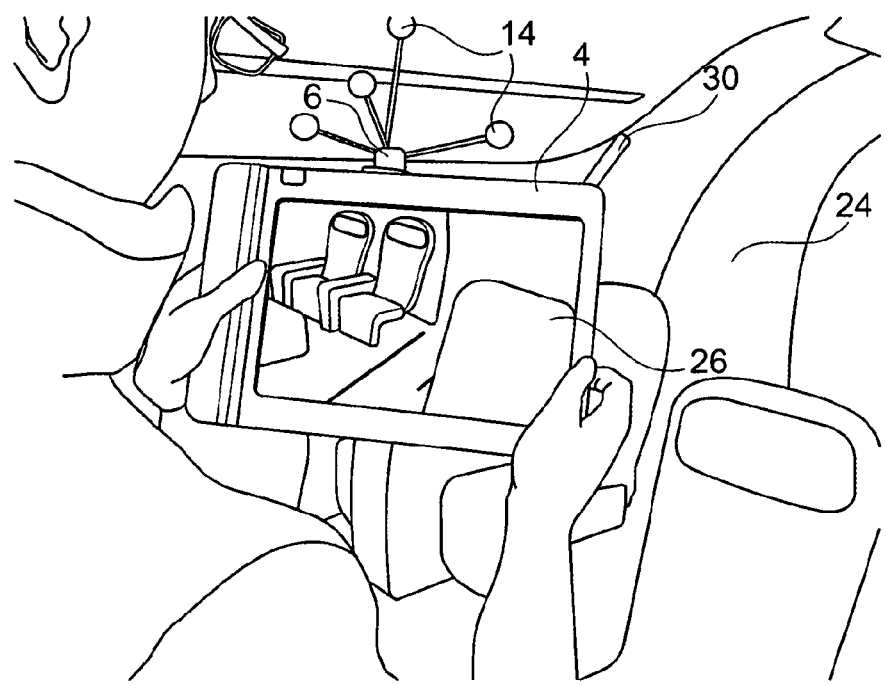

FIG. 4b shows a comparable scenario to FIG. 4a, but in this case using a visualisation device, for example a portable computer, of a larger format than the visualisation device 4 of FIG. 4a. A first position determination element 6 comprising a plurality of markers 14 is also applied on the visualisation device 4 of FIG. 4b. The visualisation device 4 further comprises a communication element 30, in this case for example an antenna, which on the one hand is capable of receiving data for example of the virtual model for display, and on the other hand is capable of feeding back information relating to an alteration of the virtual model 26, for example to a central processing unit with a connected database.

Thus, both of the visualisation devices 4 according to FIG. 4a, b provide a virtual window into a real environment, and this display can be selectively adapted so as to convey an altered visual impression.

Figure 5A:
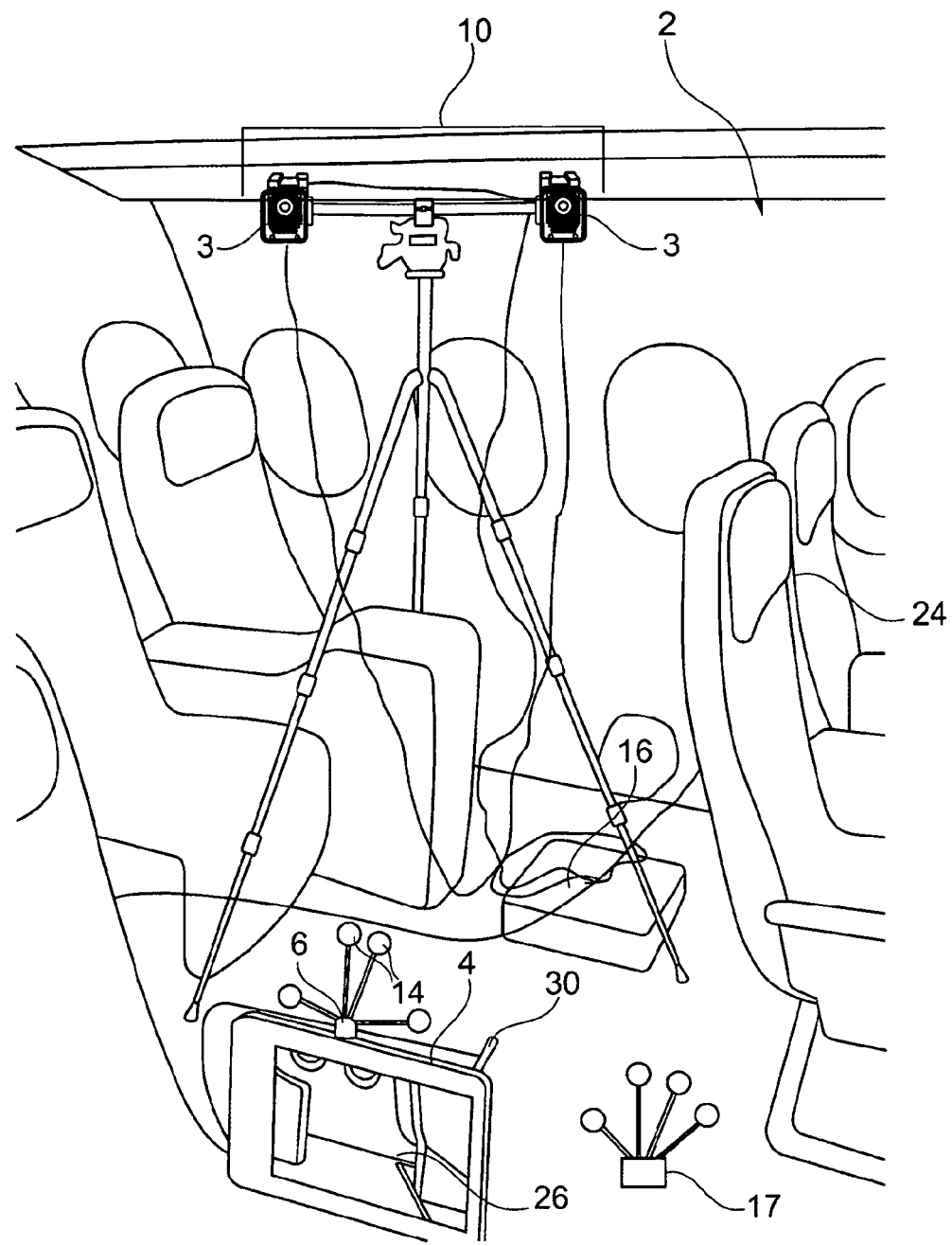
FIG. 5a, b show an exemplary embodiment of an arrangement for the combined display of a real and a virtual model according to the present disclosure in a 3D view and a view from above.

Reference is further made to FIG. 5a, b, which show an exemplary embodiment of an arrangement for the combined display of a real and a virtual model according to the present disclosure. FIG. 5a shows a complete 3D overview of an arrangement for the combined display of a real and a virtual model. A position determination device 10 is mounted on a tripod and covers a spatial region in the real model 24 by using the two infra-red camera elements 3. FIG. 5a further shows the visualisation device 4 according to FIG. 4b. A computer system 16 is linked to the infra-red camera elements 3, and may further comprise a radio connection, using the communication element 30, to the visualisation device 4.

Thus, analyses on variant display and admissibility can be carried out in a combined real and virtual environment. Calibration of a first position determination element 8 with the associated relationship thereof to the visualisation device 4 may be required, for example, taking into account the orientation of the information recording device 28 of the visualisation device 4.

A reference marker 17 is used to construct the relationship between the real and the virtual coordinate system. The position/orientation of the reference marker 17 is known both in the real model 24 and in the virtual model 26, and therefore makes it possible to map the two coordinate systems onto one another in a simple manner. It is perfectly possible to use a plurality of reference markers 17, even simultaneously, in a system of this type. The reference marker is applied to the real model so as to be fixed in location and orientation.

Figure 5B:
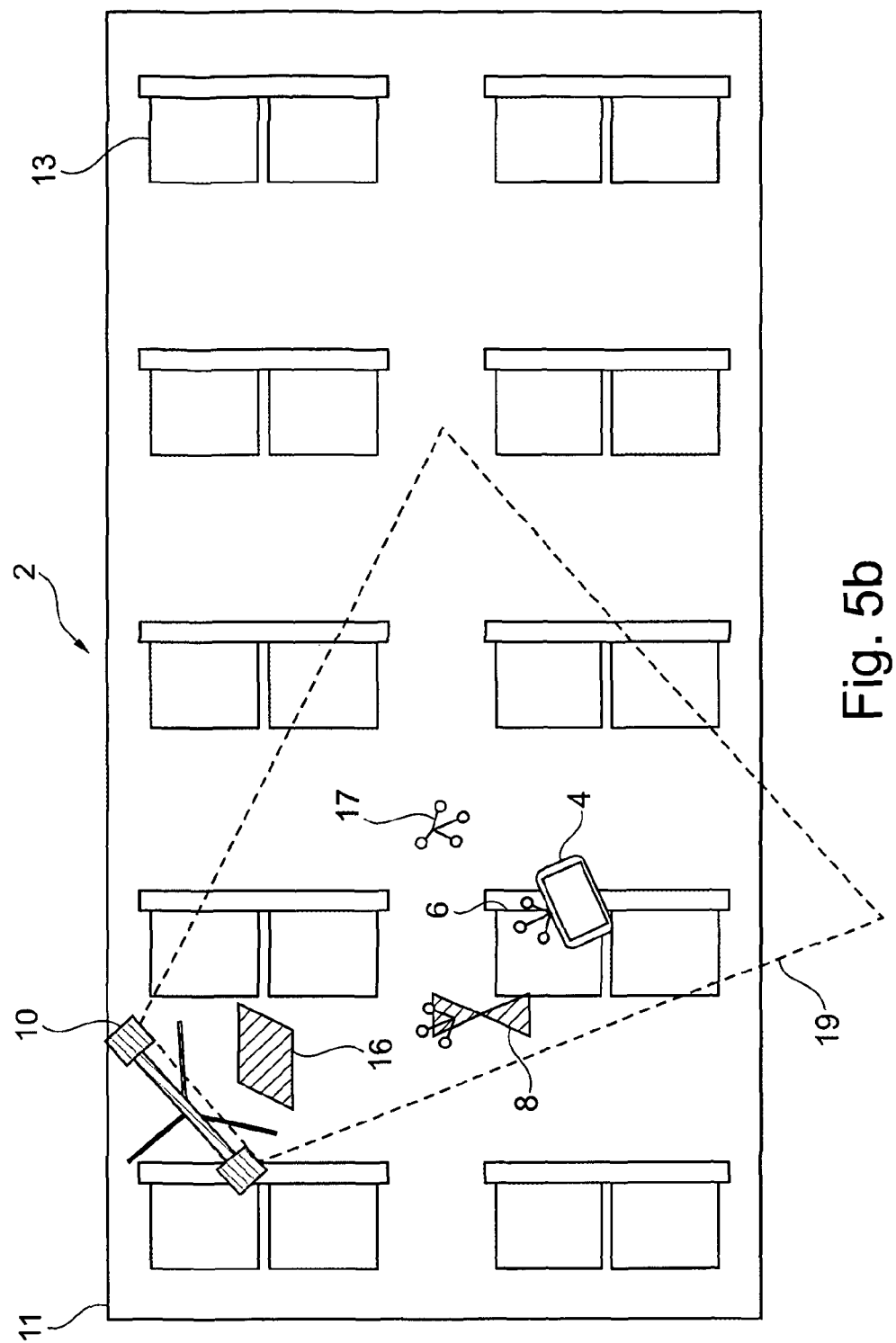

Reference is further made to FIG. 5b, which is a plan view of the arrangement according to FIG. 5a.

A position determination device 10 is arranged by way of example in an aircraft cabin 2 and connected to the computer system 16. Monuments or groups of aircraft seats 13 are also arranged in the aircraft cabin 2. A tool comprising a second position determination device 8, a visualisation device 4 comprising a first position determination element 6, and a reference marker 17 are further arranged in the field of vision 19 of the position determination device 10.

An exemplary method may take place as outlined in the following. The position determination device 10 localises itself via the reference marker 17 inside the virtual model 26, the position of said marker in the virtual model 26 being known. If a plurality of reference markers 17 are detected in the field of vision 19, the localisation may accordingly be optimised so as to increase the precision thereof. The position detection device 10 may now detect the position and/or orientation of the tool element 8 or the visualisation device 4 in the real model 24, so as also to localise or image these within the virtual model 26. This may for example take place using transformations and multiplications in succession. The tool element 8 may communicate independently with the virtual model 26; in the case of the visualisation device 4 this may take place using a graphical user interface (GUI), and in the tool element 8 it may also take place by means of callipers or other sensors.

Reference is further made to FIG. 6, which shows an exemplary embodiment of a method for simulating a virtual model in the context of a real model according to the present disclosure. FIG. 6 shows a method 40 for simulating a virtual model in the context of a real model, which comprises, simultaneously or sequentially, providing 42 a referenced real model and a real tool element (8) and providing 44 a referenced virtual model and a virtual tool element (9). In this context, the real tool element (8) and the virtual tool element (9) are logically or functionally assigned to one another.

Subsequently, the virtual model 26 may be displayed 46 by using the reference of the real model 24, and in this context a relationship may further be produced 50 between the real model 24 and the virtual model 26. On the other hand, an overall model including at least one part of a real model 24 and at least one part of a virtual model 26 may be displayed 48. In this context, it may be possible to display the at least one part of the real model 24 and the at least one part of the virtual model 26 superposed at least in part. A parameter of the real model may be determined 52 by using the real tool element (8), it being possible to alter the virtual model 26 by using the parameter. On the other hand, it is possible to engage with the parameters of the virtual model 26 directly so as to alter said model.

Figure 7:
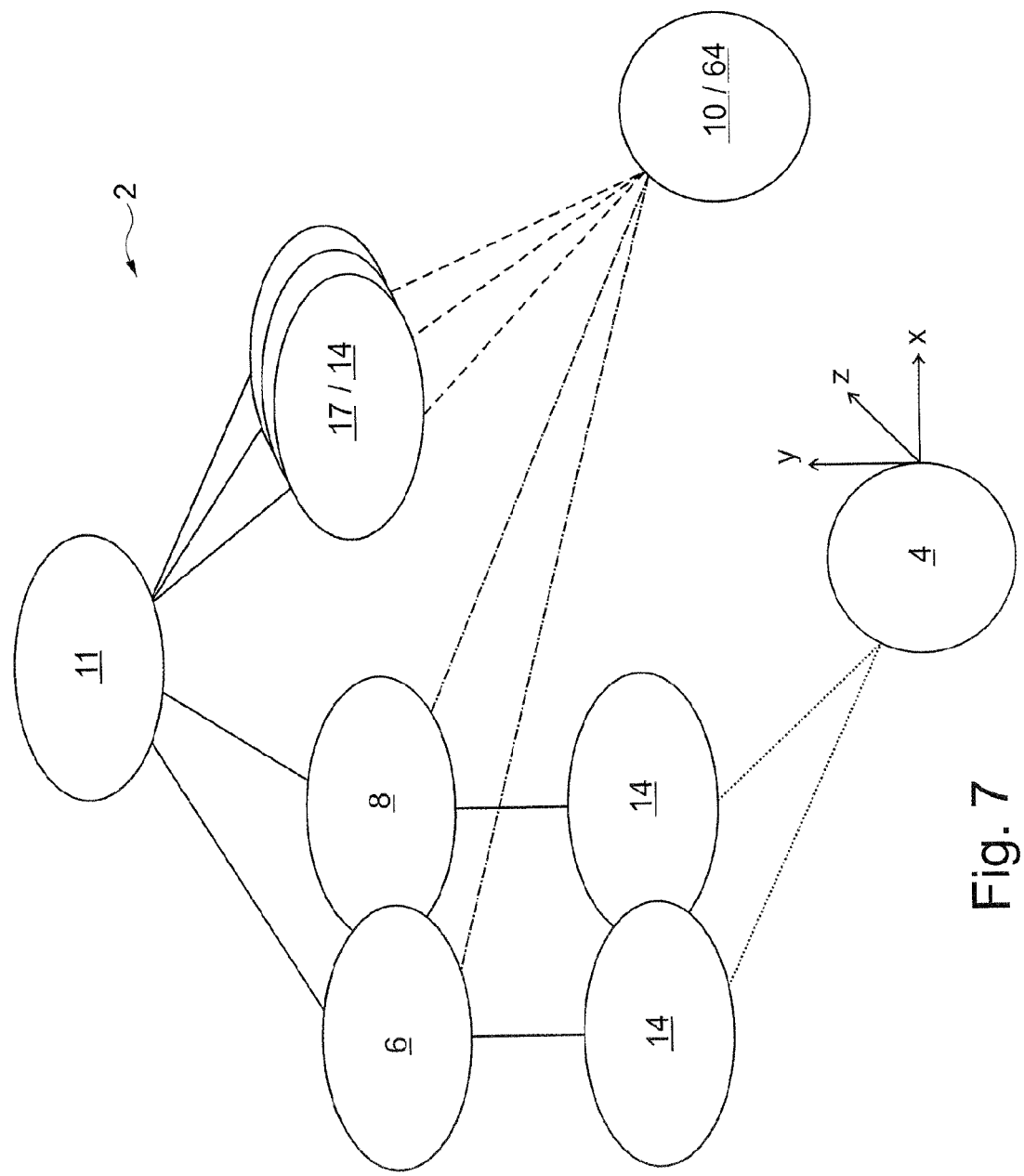
FIG. 7 is an exemplary schematic drawing of an arrangement for verifying a real model and for using a virtual model according to the present disclosure.

Reference is further made to FIG. 7, which is an exemplary schematic drawing of the arrangement for verifying a real model and for using a virtual model according to the present disclosure.

The arrangement 2 comprises an aircraft cabin 11 or aircraft structure 11, on which by way of example a first position determination element 6 and a second position determination element 8 are applied. A reference marker 17 is further applied on the aircraft structure 11. In this context, the solid lines represent a fixed or defined link; for example, the position determination elements 6, 8 and the reference marker 17 are applied fixedly on the aircraft structure, for example screwed.

The first and the second position determination element 6, 8 comprise individual marker elements 14, which are arranged so as to determine uniquely the position and/or orientation of the first position determination element 6 and the second position determination element 8. In this context, marker elements 14 may by way of example be passive reflectors or actively glowing elements, for example in the IR range of the spectrum.

A visualisation device 4 may be configured so as to be able to establish the individual position, in relation to the markers 14, of the first and the second position determination element 6, 8, for example by means of the position determination device 10. This makes a position of the visualisation device 4 in space in relation to the first and the second position determination element 6, 8 possible. In this context, dashed lines do not represent a fixed connection. The visualisation device 4 is thus movable in relation to the markers 14 in the real model 24 of the aircraft cabin 11. However, a current position and/or orientation can be determined at any time by means of the visualisation device 4.

It should be noted that each element which can be localised comprises a marker assembly, that is to say a plurality of markers 14, so as to be locatable in space. In this context, the individual markers 14 of an element form an assembly by means of which they can be detected in space. So as to be able to perceive a plurality of elements simultaneously, marker assemblies of different elements may be configured individually and distinguishably. For example, in so far as possible, the geometric shapes of the marker assemblies should not be transformable into one another by translation, rotation or scaling, since otherwise a plurality of elements would not be uniquely perceptible, or at least would not be distinguishable, in space by an optical system.

It is also possible for the markers 14 to be configured as active elements, for example LEDs, for example, IR LEDs. As well as or instead of a spatial arrangement, these markers may also have a predetermined and individual activity, for example on/off state, blink frequency, blink pattern and/or intensity. For this purpose, control or synchronisation of the markers may be required. This is required, for example, if the markers do not have a spatially unique arrangement. For example, the arrangement of the markers is shown as substantially mirror symmetric and rotationally symmetric in FIG. 8. By contrast, by way of example, the system in FIGS. 1b and 2 uses unique retro-reflective markers, and thus need not identify the markers 14 or LEDs by way of synchronised points in time, but can detect all of the retro-reflective markers at the same time.

The marker assembly need not be applied on an individual reference target; rather it may be possible to determine the position of each marker precisely by way of the calibration. For this purpose, it would also be possible to introduce and calibrate the markers individually, for example by way of the laser measurement system or calibration system 64, and to interpret them as a marker assembly collectively.

It may be possible to fix the first position determination element 6 and the second position determination element 8 in/on the real model 24 in positions which are defined in advance, which are also known in the virtual model 26 as corresponding fixing points. In this case, registration of the first position determination element 6 and the second position determination element 8 in relation to the aircraft cabin 11 is not required. If a further position determination element, for example a reference marker 17, is applied at a point of the real model 24 which is not designated in greater detail in the virtual model 26, offline registration of the position of the reference marker 17 may be required. For this purpose, the position determination device 10 may for example be used together with the calibration device 64.

The reference marker 17 may be applied at any desired position on/in the aircraft cabin 11. Subsequently, by using the calibration device 64, known calibration points 62 of the reference marker 17 and the aircraft cabin 11 are initiated, and as a result a fixed relationship between the reference marker 17 and the aircraft cabin 11 or aircraft structure 11 is produced. For this purpose, on the one hand known calibration points of the aircraft structure 11 may be used, which are thus known in the virtual model, or alternatively, the first or the second position determination element 6, 8 may be used on the basis of the position thereof, which is also known, in the aircraft cabin 11.

Figure 8:
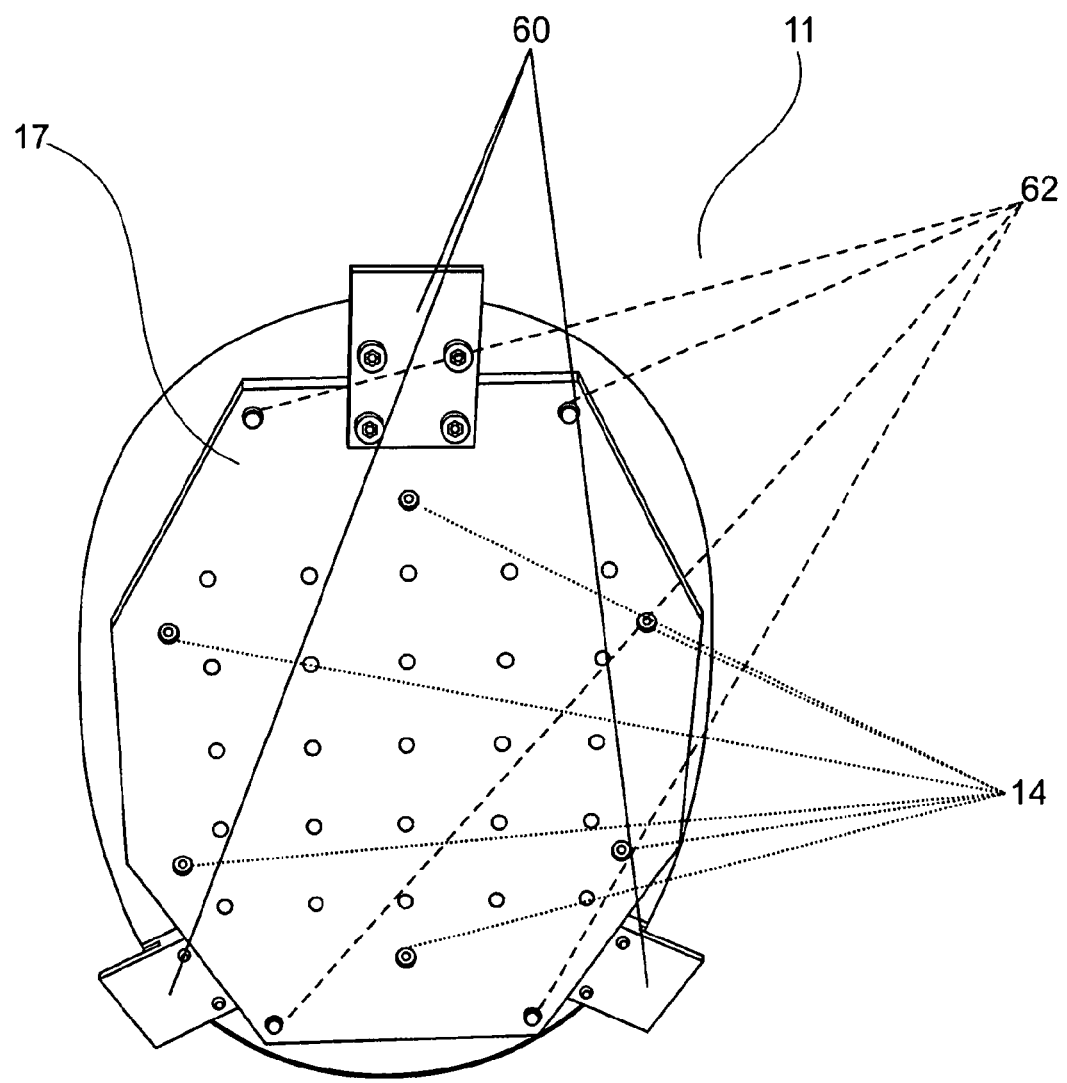
FIG. 8 shows an exemplary embodiment of a reference marker according to the present disclosure.

Reference is further made to FIG. 8, which shows an exemplary embodiment of a reference marker according to the present disclosure.

The reference marker 17 is fixedly attached to the aircraft structure 11 by using clamps 60. Because of the large-area application and configuration of the reference marker 17, a visibility is provided in the aircraft cabin 11. The reference marker 17 comprises fixing options for (passive) marker elements 14, or else even active marker elements 14. These may be configured in a defined manner, so as to provide a defined position and/or orientation in space when recorded with a visualisation device 4 or a position determination device 10. Calibration points 62 are provided on the reference marker 17 so as to fix it in space by using a calibration device 64 and to place it in a relationship with the virtual model 26 and the real model 24.

Figure 9A:
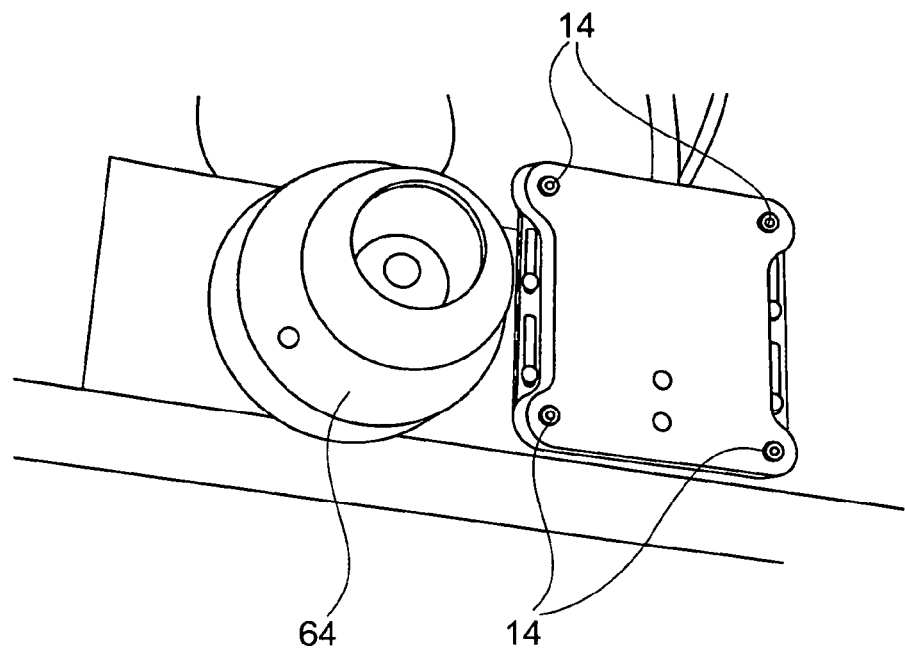
FIG. 9a, b show exemplary embodiments of a position determination device with an associated calibration device according to the present disclosure.

Reference is further made to FIG. 9a, b which show exemplary embodiments of a position determination device with an associated calibration device according to the present disclosure.

Figure 9B:
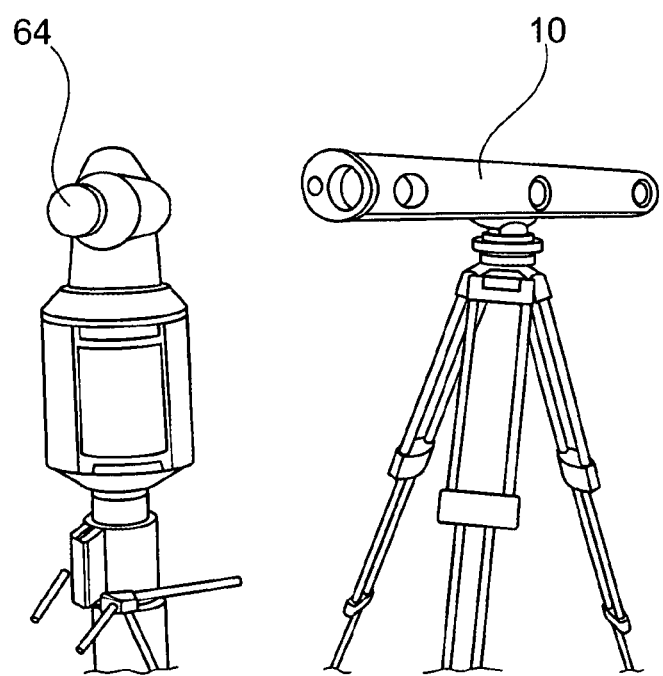

FIG. 9b shows the position determination device 10 and the calibration device 64. Marker elements 14 are fixedly installed in the aircraft by using the reference marker 17. This may on the one hand take place by way of the clamp system of the reference marker 17 according to FIG. 8, or else by way of special adapters, which make it possible in a simple manner to receive the marker elements 14 fixedly in a defined manner with a predetermined position. As a result, the markers 14 can easily be removed and applied again if a production step requires this, without altering the position and orientation of the marker 14, and thus without triggering a further registration. The reference marker 17 may also itself be configured in such a way that it can be separated, for example from a base support, and can subsequently be applied again in a defined manner, as before.

The position and orientation of a reference marker 17 may be measured or established in various ways. Either an offline measurement system or an online measurement system may be used.

The reference marker 17 comprises a plurality of markings, calibration points 62, for registering a registration in relation to the aircraft structure 11, for example, a transformation between the aircraft and the reference marker 17. The reference marker 17 also comprises markers 14, in such a way that said markers can be detected by an online measurement system or tracking system, for example the visualisation device 4.

By using a high-precision offline measurement system, special measuring processes can be carried out, which are predefined in relation to a real model 24 in connection with a virtual model 26 and which may subsequently be analysed offline. A reference marker 17 for use in an offline system may therefore have to be fixedly positioned in relation to the aircraft structure 11 so as to prevent measurement errors.

Further, vibrations of the aircraft structure 11 may have to be kept low, in such a way that production should in so far as possible be paused in a vibration state of this type.

So as to fix the reference marker 17 in a defined manner in relation to the aircraft structure 11, calibration points 62 are used. At least three points are required so as to establish a transformation between the offline measurement system, for example including the position determination device 10 together with the calibration device 64, and the virtual coordinate system of the virtual model. As a result, measurements of positions and lengths are carried out in the same coordinate system and may thus be outputted and processed further directly. If more than three calibration points are used, the registration error between the offline measurement system and the aircraft structure 11 may be reduced. Vibrations during and after the registration invalidate the registration as a result of a possible shift in position and/or orientation of the offline measurement system, for example the position determination device 19, which is not fixedly connected to the aircraft structure 11, and this may result in a further registration procedure.

A high-precision offline measurement system of this type may usually be used to measure a single parameter, for example, when large spaces are to be bridged. A corresponding offline measurement system may for example be a laser measurement system. The calibration device 64 may also comprise a laser measurement system of this type. For registering the offline measurement system, in relation to the reference marker 17, the reference marker 17 may be registered by calibration, for example by means of the laser measurement system or the calibration device 64, of reference points in the aircraft and calibration points 62 of the reference marker 17.

In one example, position determination may be provided by way of the laser measurement system on the basis of reference points which are fixed in the aircraft, with subsequent calibration of the reference marker 17. In other words, in this context the position of the laser measurement system is initially established in relation to the aircraft structure, and subsequently the relationship of the reference marker 17 to the laser measurement system is established. On the basis of the associated relationship, a relationship can thus be provided between the aircraft structure and the reference marker 17.

FIG. 9a shows a further exemplary embodiment of a reference marker 17. The laser target 65 may be detected by the laser of the calibration device 64. The marker arrangement, including by way of example 4 active LED markers 14, may be detected by the position determination device 10. So as to introduce a reference marker 17 of this type into the real model, for example an aircraft, at least 3 points on the reference marker 17 may be measured by the laser of the calibration device 64. For this purpose, calibration points which are similar to the calibration points 62 according to FIG. 8 may for example be used, but are not shown in FIG. 9a. In this context, more than 3 calibration points 62 make overdetermination possible for error minimisation.

Reference is further made to FIG. 10a, b, which are exemplary schematic drawings of the arrangement for verifying a real model by using a virtual model according to the present disclosure. In this context, FIG. 10 basically corresponds to the corresponding elements of FIG. 7.

The online tracking system further comprises a checking tip as the real tool element 8. The checking tip comprises markers 14. As a result, a position of the checking tip in space and an associated orientation can basically be established. The system further comprises the visualisation device 4, on which markers 14 are also applied in a defined manner. As a result, the position and/or orientation of the visualisation device 4 in space can be determined. The visualisation device 4 may also have an information recording device, which is in turn arranged so as to detect for example the first position determination element 6 and thus to determine a position of the visualisation device 4 in space.

The position of the visualisation device 4 may be detectable by means of the position determination device 10. Both in the case of external localisation of the visualisation device 4 by the position determination device 10 and in the case of intrinsic position determination of the visualisation device 4, the position and/or orientation thereof in space and thus in relation to the aircraft structure 11 or to the aircraft cabin 11 is known. As a result, a virtual model 26 can be imaged on a display of the visualisation device 4, corresponding to the prevailing position.

It may be possible to overlay a virtual tool element 9 into the virtual model 26, which for example constitutes a virtual pendant for the real tool element 8 or the checking tip thereof. In this way, a measurement may be carried out for example in the virtual model 26 with the virtual tool element 9, and be checked in the real model 24 with the real tool element 8. The two measurement values can subsequently be placed in reaction with one another, for example so as to establish a manufacturing tolerance.

Figure 11:
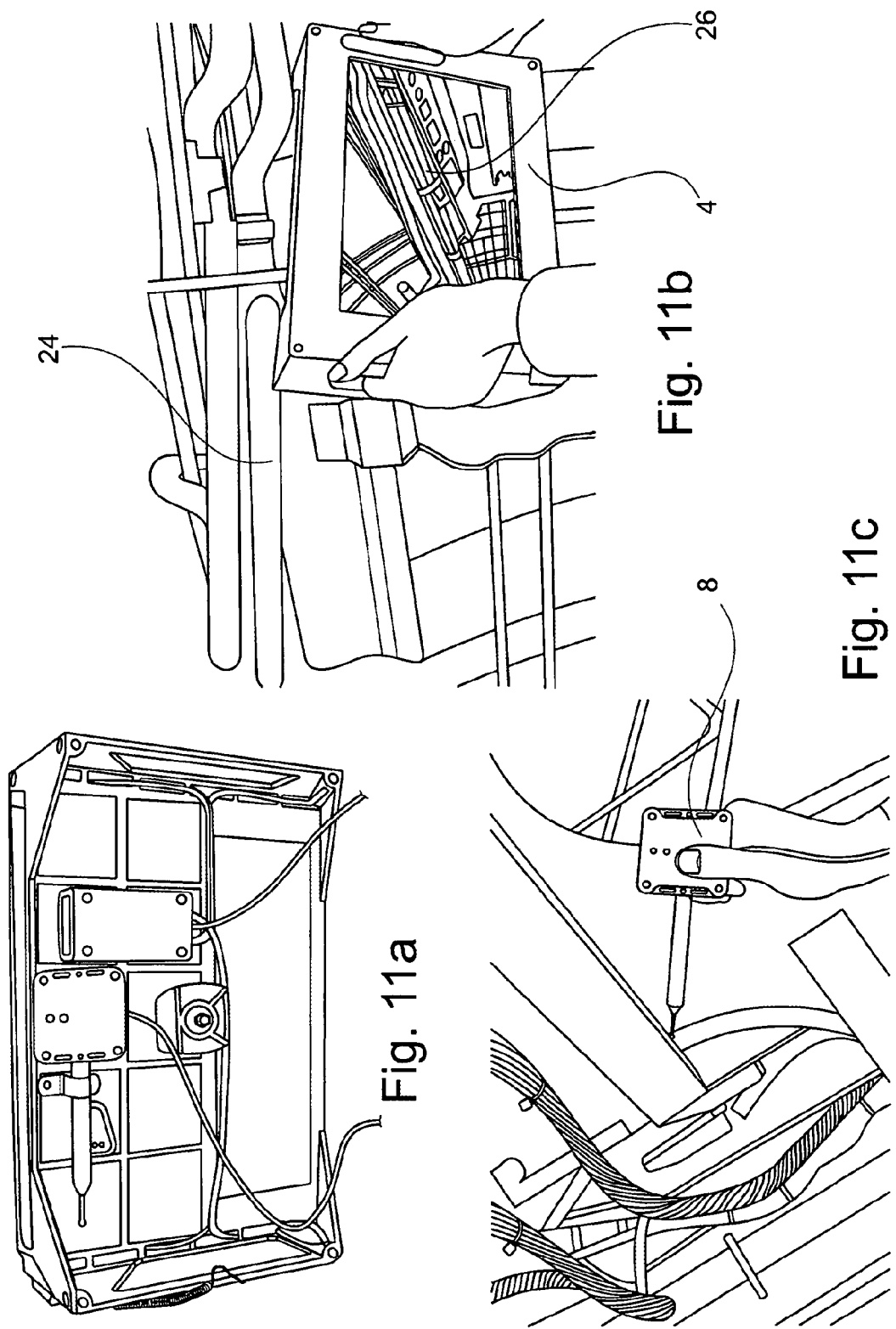
FIG. 11a-c show an exemplary application scenario of the arrangement according to the present disclosure.

Reference is further made to FIG. 11a-c, which show an exemplary application scenario of the arrangement according to the present disclosure.

FIG. 11a is an example rear view of the visualisation device 4. In this context, the second position determination element 8 or real tool element 8 is linked by cable to the visualisation device 4. The cable link may by way of example be provided for controlling or synchronising active marker elements 14.

FIG. 11b shows the reproduction of a virtual model 26, as a function of the position and/or orientation of the visualisation device 4, in association with which the real model 24 is visible in the background. If the visualisation device comprises an information recording device, a superposed display of the real model 24 and the virtual model 26 on the display of the visualisation device 4 is possible. Thus, individual elements of the virtual model 26 may be overlaid into the image, so as to be able to check the presence thereof and the correct application thereof in the real model 24.

In FIG. 11c, the real tool element 8 is used to carry out an operation or to determine a parameter. This may for example be the position of the hose connection, as shown in FIG. 11c, which may be compared with the provided position in the virtual model 26, so as for example to display manufacturing tolerances or detect incorrect production.

Figure 12:
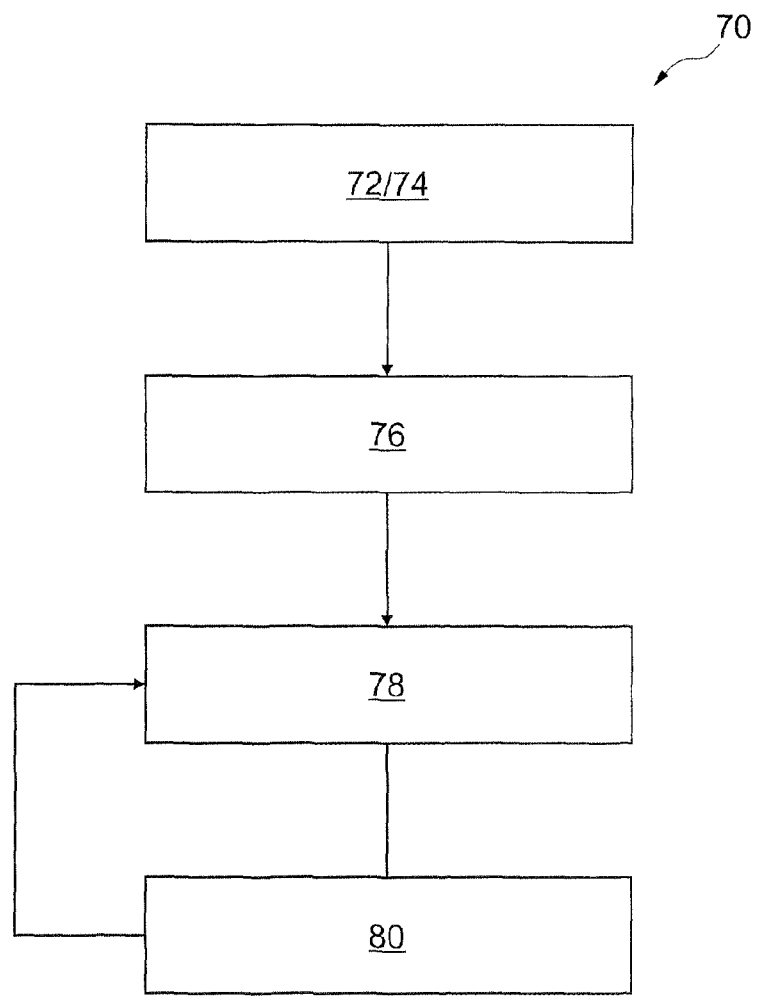
FIG. 12 shows an exemplary embodiment of the method for verifying a real model by using a virtual model according to the present disclosure.

Reference is further made to FIG. 12, which shows an exemplary embodiment of the method for verifying a real model by using a virtual model according to the present disclosure. FIG. 12 shows a method 70 for verifying a real model by using a virtual model, comprising providing 72 a referenced real model 24 and a real tool element and providing 74 a referenced virtual model 26, it being possible to assign an operation of the real tool element 8 logically or functionally to an operation in the virtual model 26. Subsequently, a relationship between the real model 24 and the virtual model 26 is produced 76. This relationship may be one of the above-described registration variants.

Now, a parameter of the real model may be determined 78 by using the real tool element 8 and compared 80 with a corresponding parameter of the operation in the virtual model 26.

In this context, steps 78 and 80 may be carried out repeatedly in the context of the operation of the arrangement according to the present disclosure.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the present disclosure in any way. Rather, the foregoing detailed description will provide those skilled in the art with a convenient road map for implementing an exemplary embodiment, it being understood that various changes may be made in the function and arrangement of elements described in an exemplary embodiment without departing from the scope of the present disclosure as set forth in the appended claims and their legal equivalents.

What is claimed is:

1. Arrangement for verifying a real model by using a virtual model, comprising:
   a real model of an aircraft structure which has a real coordinate system;
   a virtual model which has a virtual coordinate system;
   a first position determination element, which is coupled to the real model in a defined manner such that the position of the first position determination element relative to the real model is known;
   a real tool element, which is positionable in the real model; and
   a visualisation device that includes a camera, which records at least part of information associated with the real model, the visualisation device arranged to determine at least one of a position and an orientation of the visualisation device in relation to the first position determination element, and the visualisation device displays at least part of the virtual model,
   wherein at least one of a position and orientation of the real tool element in the real model is determined relative to the first position determination element, and an operation of the real tool element is triggered in the real model, with the operation of the real tool element imaged in the virtual model, and the operation of the real tool element in the real model and the imaged operation in the virtual model is logically or functionally assigned to one another,
   wherein as the real tool element performs the operation, the virtual model is altered to include the operation performed by the real tool element, and
   wherein the part of the virtual model displayed on the visualisation device is dependent on at least one of the position and orientation of the first position determination element.

2. The arrangement according to claim 1,
   wherein, as a result of the operation in the real model and the imaged operation in the virtual model being logically or functionally assigned to one another, the real operation can be verified by using the imaged operation.

3. The arrangement according to claim 1,
   wherein the at least one of the position and orientation of the real tool element can be imaged in the virtual model, by using a virtual tool element which is arranged in the virtual model.

4. The arrangement according to claim 1,
   wherein the at least one operation is an operation from the group consisting of determining position, orientation, manufacturing precision, colour value, brightness value, motion tracking, monitoring an operating sequence, triggering an action, and information on a component in the real model.

5. The arrangement according to claim 1,
   wherein the tool element comprises a second position determination element, and the second position determination element establishes a relationship of the real coordinate system with at least one of the first position determination element and the visualisation device.

6. The arrangement according to claim 1,
   wherein the visualisation device further comprises at least one element from the group consisting of a memory element and a processor element, the at least one element provides at least part of the virtual model for display.

7. The arrangement according to claim 1,
   wherein the visualisation device further comprises a communication element, and data on the position, orientation and part to be displayed of the virtual model is received using the communication element.

8. The arrangement according to claim 1,
   wherein the visualisation device displays at least part of the virtual model in such a way that it can be superposed on at least part of the recorded real model.

9. The arrangement according to claim 1, further comprising:
   a position determination device,
   wherein the position determination device is arranged so as to determine the position of the first position determination element in the real model, and to provide the position of the first position determination element in the virtual model.

10. The arrangement according to claim 1,
    wherein the visualisation device displays a result of an operation in the virtual model and the result of the operation in the real model, to enable verification of the operation in the real model by using the virtual model.

11. A method for verifying a real model by using a virtual model, comprising:
    providing a referenced real model of an aircraft structure and a real tool element, the real model of the aircraft structure including a first position determination element, which is coupled to the real model in a defined manner such that the position of the first position determination element relative to the real model is known;
    providing a referenced virtual model;
    assigning an operation of the real tool element to an operation in the virtual model;
    producing a relationship between the real model and the virtual model;
    determining a parameter of the real model by using the real tool element;
    comparing the parameter of the real model with a parameter of the operation in the virtual model;
    performing the operation with the real tool element;
    updating the virtual model to include the operation performed by the real tool element;
    recording at least part of information associated with the real model with a camera of a visualisation device, the visualisation device arranged to determine at least one of a position and an orientation of the visualisation device in relation to the first position determination element; and
    displaying at least part of the virtual model on the visualisation device,
    wherein the part of the virtual model displayed on the visualisation device is dependent on at least one of the position and orientation of the first position determination element.

12. The method according to claim 11, further comprising:
    displaying an overall model of at least one part of the real model and at least one part of the virtual model.

13. The method according to claim 12, further comprising:
    displaying the virtual model with reference to the real model; and
    displaying the at least one part of the real model superimposed on the at east one part of the virtual model at least in part.

14. A method of constructing an aircraft comprising:
providing an aircraft including a real model and a real tool element, the real model including a first position determination element, which is coupled to the real model in a defined manner such that the position of the first position determination element relative to the real model is known;
providing a virtual model;
assigning an operation of the real tool element relative to the aircraft to an operation in the virtual model;
producing a relationship between the real model and the virtual model;
determining a parameter of the real model by using the real tool element;
comparing the parameter of the real model with a parameter of the operation in the virtual model to aid in aircraft construction;
performing the operation with the real tool element on the aircraft;
altering the virtual model to include the operation performed by the real tool element on the aircraft;
recording at least part of information associated with the real model with a camera of a visualisation device, the visualisation device arranged to determine at least one of a position and an orientation of the visualisation device in relation to the first position determination element; and
displaying at least part of the virtual model on the visualisation device,
wherein the part of the virtual model displayed on the visualisation device is dependent on at least one of the position and orientation of the first position determination element.

15. The method of claim 14, further comprising:
displaying the at least one part of the real model superimposed on the at east one part of the virtual model.

16. The method of claim 14, wherein the operation performed by the real tool element is drilling a hole in the aircraft and altering the virtual model to include the operation comprises:
altering the virtual model to include the hole drilled by the real tool element in the aircraft.

* * * * *

UNITED STATES PATENT AND TRADEMARK OFFICE
CERTIFICATE OF CORRECTION

| | | |
|---|---|---|
| PATENT NO. | : 8,849,636 B2 | Page 1 of 1 |
| APPLICATION NO. | : 13/525970 | |
| DATED | : September 30, 2014 | |
| INVENTOR(S) | : Benjamin Becker et al. | |

It is certified that error appears in the above-identified patent and that said Letters Patent is hereby corrected as shown below:

In the Claims,

Column 30, line 66, Claim 13, line 5, "east" should be changed to --least--

Signed and Sealed this
Third Day of March, 2015

Michelle K. Lee
*Deputy Director of the United States Patent and Trademark Office*